(12) United States Patent　　(10) Patent No.: US 12,170,284 B2
Liu　　(45) Date of Patent: Dec. 17, 2024

(54) SEMICONDUCTOR ON INSULATOR HAVING A SEMICONDUCTOR LAYER WITH DIFFERENT THICKNESSES

(71) Applicant: Taiwan Semiconductor Manufacturing Company, Ltd., Hsinchu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 489 days.

(21) Appl. No.: 17/376,623

(22) Filed: Jul. 15, 2021

(65) Prior Publication Data

US 2023/0018629 A1　　Jan. 19, 2023

(51) Int. Cl.
*H01L 27/12*　　(2006.01)
*H01L 21/762*　　(2006.01)
*H01L 21/84*　　(2006.01)

(52) U.S. Cl.
CPC .... *H01L 27/1203* (2013.01); *H01L 21/76251* (2013.01); *H01L 21/76264* (2013.01); *H01L 21/84* (2013.01)

(58) Field of Classification Search
CPC ......... H01L 21/76264; H01L 21/76251; H01L 21/84; H01L 27/1203; H01L 21/78; H01L 21/784; H01L 21/782; H01L 21/762; H01L 21/301; H01L 21/302; H01L 21/76229
See application file for complete search history.

(56) References Cited

U.S. PATENT DOCUMENTS

| | | | | |
|---|---|---|---|---|
| 5,091,330 | A * | 2/1992 | Cambou | H01L 21/76264 148/DIG. 12 |
| 6,372,600 | B1 * | 4/2002 | Desko | H01L 23/544 438/692 |
| 6,492,209 | B1 * | 12/2002 | Krishnan | H01L 21/84 438/719 |
| 2006/0216898 | A1 * | 9/2006 | Tigelaar | H01L 27/1203 438/295 |
| 2007/0117306 | A1 * | 5/2007 | Oyamatsu | H01L 21/76229 257/E21.573 |
| 2013/0270711 | A1 * | 10/2013 | Hebding | H01L 25/0652 438/455 |
| 2018/0331221 | A1 | 11/2018 | Berthelon et al. | |
| 2019/0057981 | A1 | 2/2019 | Fagot et al. | |
| 2020/0075633 | A1 * | 3/2020 | Liang | H01L 23/5226 |

FOREIGN PATENT DOCUMENTS

TW　　202008583 A　　2/2020

* cited by examiner

*Primary Examiner* — Latanya N Crawford Eason
(74) *Attorney, Agent, or Firm* — Eschweiler & Potashnik, LLC

(57) ABSTRACT

Various embodiments of the present disclosure are directed towards an integrated chip. The integrated chip comprises a semiconductor substrate. A semiconductor layer is disposed over the semiconductor substrate. An insulating structure is buried between the semiconductor substrate and the semiconductor layer. The insulating structure has a first region and a second region. The insulating structure has a first thickness in the first region of the insulating structure, and the insulating structure has a second thickness different than the first thickness in the second region of the insulating structure.

20 Claims, 15 Drawing Sheets

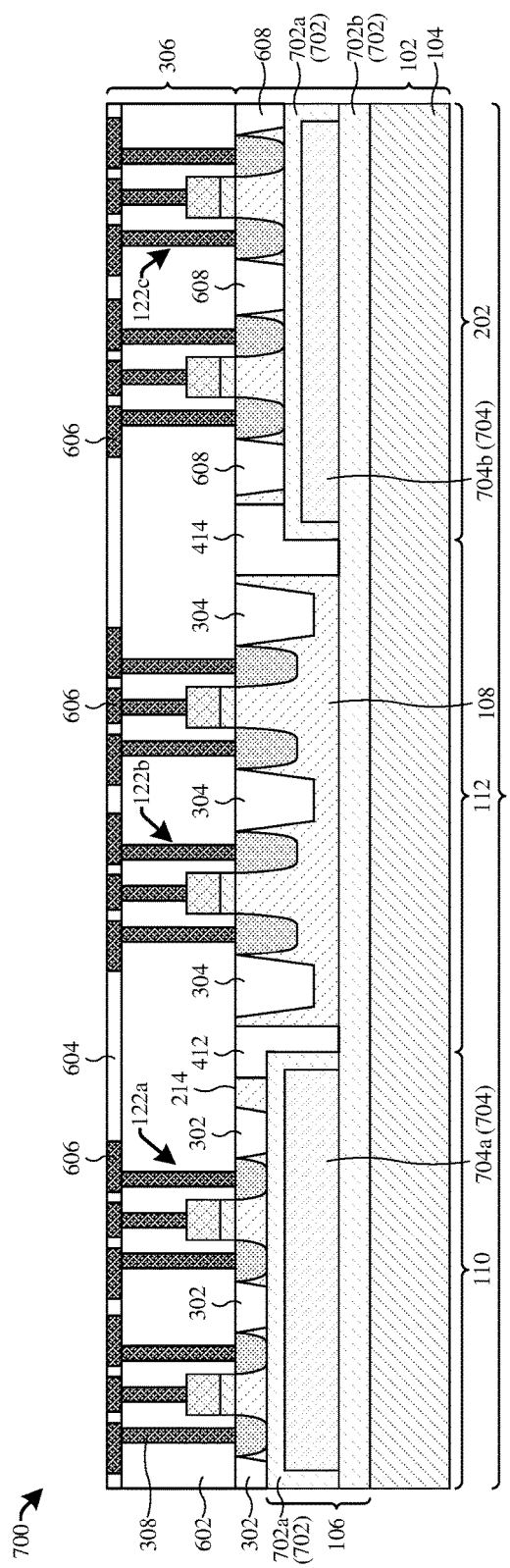
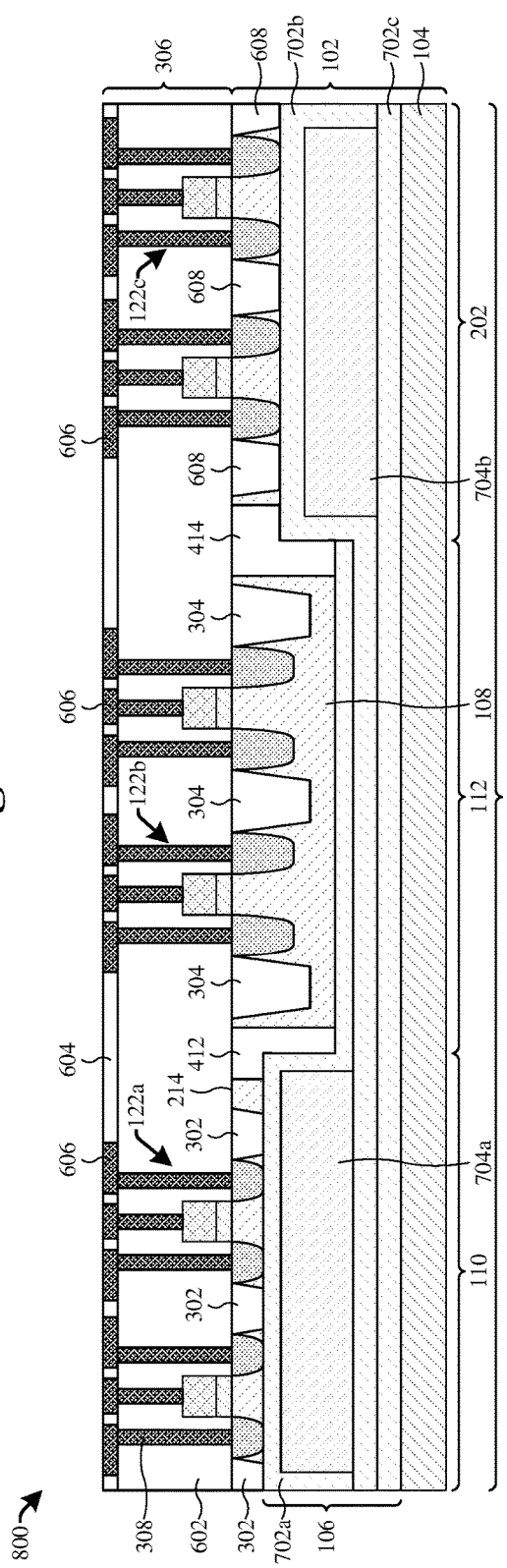
Fig. 7
Fig. 8

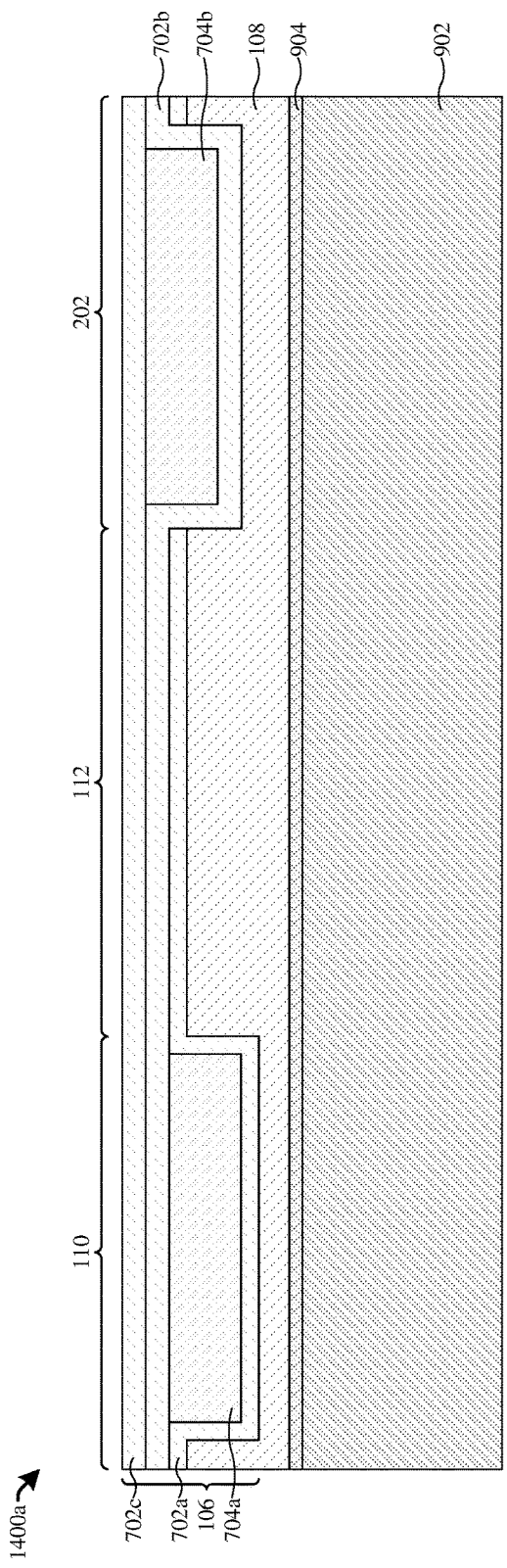
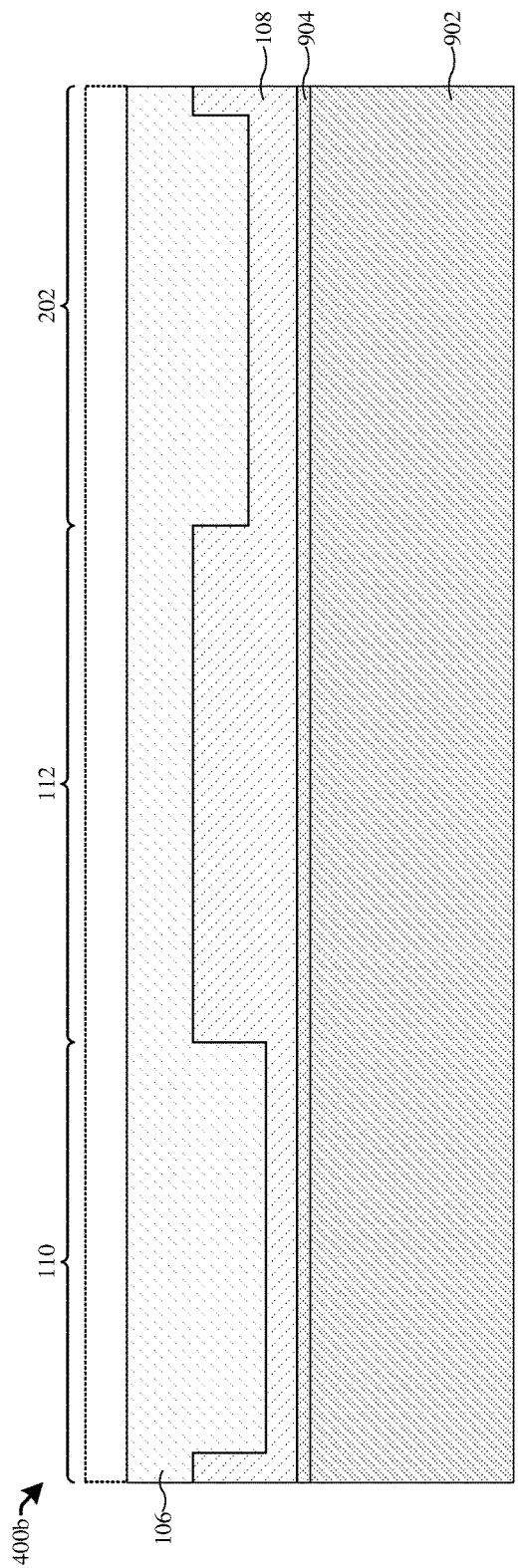
Fig. 14A
Fig. 14B

SEMICONDUCTOR ON INSULATOR HAVING A SEMICONDUCTOR LAYER WITH DIFFERENT THICKNESSES

BACKGROUND

Semiconductor devices are electronic components that exploit electronic properties of semiconductor materials to affect electrons or their associated fields. A widely used type of semiconductor device is metal-oxide-semiconductor field-effect transistor (MOSFET). Semiconductor devices have traditionally been formed on bulk semiconductor substrates. In recent years, semiconductor-on-insulator (SOI) substrates have emerged as an alternative to bulk semiconductor substrates. An SOI substrate comprises a first semiconductor material layer, an insulating layer overlying the first semiconductor material layer, and a second semiconductor material layer overlying the insulating layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a cross-sectional view of some other embodiments of the IC of FIG. 1.

FIG. 8 illustrates a cross-sectional view of some other embodiments of the IC of FIG. 7.

FIGS. 9-19 illustrates a series of cross-sectionals views of some embodiments of a method for forming an IC comprising a SOI substrate having a semiconductor layer with different thicknesses.

DETAILED DESCRIPTION

Figure 1:
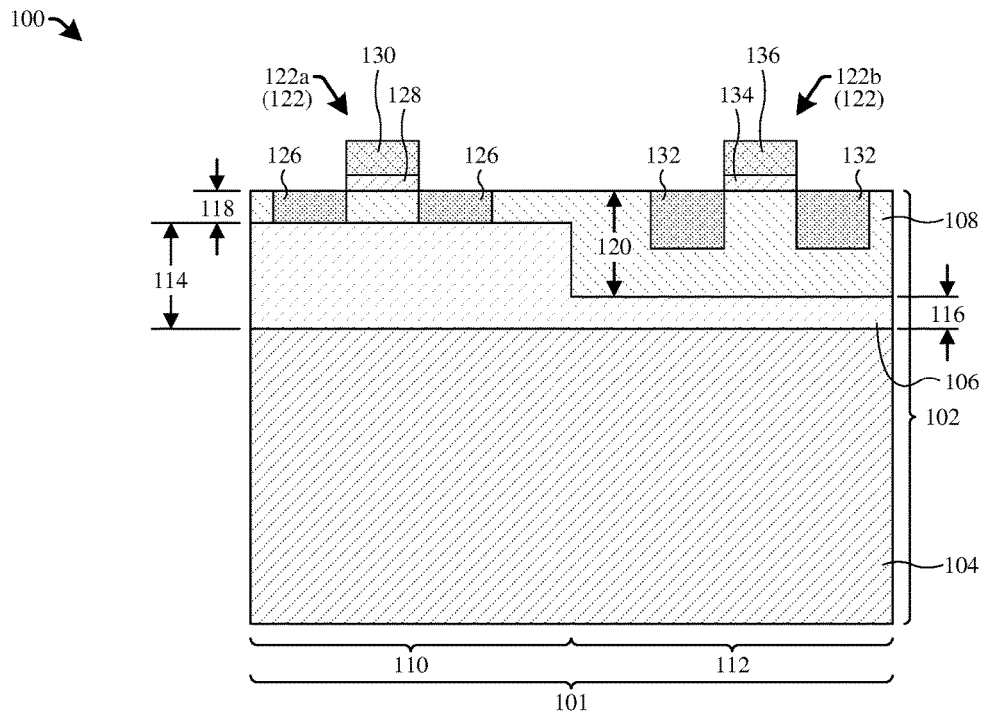
FIG. 1 illustrates a cross-sectional view of some embodiments of an integrated chip (IC) comprising a semiconductor-on-insulator (SOI) substrate having a semiconductor layer with different thicknesses.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise a plurality of semiconductor devices (e.g., insulated gate field-effect transistors (IGFETs)) disposed over/within a semiconductor-on-insulator (SOI) substrate. The SOI substrate comprises an insulating layer vertically separating a semiconductor layer from a semiconductor substrate. Typically, the semiconductor layer has a substantially uniform thickness across the entirety of the SOI substrate. Further, the insulating layer typically has a substantially uniform thickness across the entirety of the SOI substrate.

One challenge with the above SOI substrate is integrating different types of semiconductor devices (e.g., IGFETs with different signal processing functions) onto a single SOI substrate. More specifically, the challenge is integrating different types of semiconductor devices that benefit from different thicknesses of the semiconductor layer of the SOI substrate. For example, logic devices benefit from being disposed over/within a very thin semiconductor layer (e.g., fully-depleted semiconductor-on-insulator (FDSOI) substrate), radio frequency (RF) switching devices benefit from being disposed over/within a moderately thin semiconductor layer (e.g., partially-depleted semiconductor-on-insulator (PDSOI) substrate), and power devices and/or input/output (I/O) devices benefit from being disposed over/within a thick semiconductor layer (e.g., bulk-like SOI substrate). More specifically, the logic devices disposed over/within the very thin semiconductor layer benefit from low substrate leakage and high switching speeds, the RF switching devices disposed over/within the moderately thin semiconductor layer benefit from a low capacitance when the RF switching devices are in an off state (e.g., $C_{OFF}$), and the power devices and/or the I/O devices disposed over/within the thick semiconductor layer benefit from having good threshold voltage control due to the ability of fixing a body potential.

Various embodiments of the present application are directed toward an integrated chip (IC). The IC comprises an SOI substrate. The SOI substrate comprises a semiconductor substrate, an insulating structure, and a semiconductor layer. The semiconductor layer is disposed over the semiconductor substrate. The insulating structure is buried between the semiconductor substrate and the semiconductor layer. The IC has a first IC region and a second IC region. The semiconductor layer has a first thickness in the first IC region. The semiconductor layer has a second thickness in the second IC region. The second thickness is different than the first thickness. Because the semiconductor layer has a different thickness in the first IC region and the second IC region, different types of semiconductor devices (e.g., IGFETs with different signal processing functions) may be integrated onto a single SOI substrate. For example, logic devices may be disposed over/within the semiconductor layer of the first IC region, thereby benefiting from the first thickness of the semiconductor layer, and RF switching devices may be disposed over/within the semiconductor layer of the second IC region, thereby benefiting from the second thickness of the semiconductor layer. Thus, the performance of the IC may be improved (e.g., lower power consumption, higher switching speed, etc.) due to the semiconductors layer having different thicknesses.

FIG. 1 illustrates a cross-sectional view 100 of some embodiments of an integrated chip (IC) 101 comprising a semiconductor-on-insulator (SOI) substrate 102 having a semiconductor layer 108 with different thicknesses.

As shown in the cross-sectional view 100 of FIG. 1, the IC 101 (e.g., a system on a chip (SoC)) comprises an SOI substrate 102. The SOI substrate 102 comprises a semiconductor substrate 104. The semiconductor substrate 104 may be any type of semiconductor material, for example, silicon (Si), germanium (Ge), silicon-germanium (SiGe), gallium arsenide (GaAs), some other semiconductor material, or a combination of the foregoing. In some embodiments, the semiconductor substrate 104 is silicon (Si). In further embodiments, the semiconductor substrate 104 is monocrystalline silicon (Si). In some embodiments, the semiconductor substrate 104 may be doped (e.g., doped with n-type or p-type dopants) or intrinsic (e.g., undoped). In some embodiments, an upper surface of the semiconductor substrate 104 is substantially planar (e.g., substantially flat), as shown in the cross-sectional view 100 of FIG. 1.

An insulating structure 106 is disposed over the semiconductor substrate 104. The insulating structure 106 is an electrical insulator. The insulating structure 106 may be or comprise, for example, an oxide (e.g., silicon dioxide (SiO$_2$)), a nitride (e.g., silicon nitride (SiN)), an oxy-nitride (e.g., silicon oxy-nitride (SiON)), a carbide (e.g., silicon carbide (SiC)), sapphire, some other electrically insulating material, or a combination of the foregoing.

A semiconductor layer 108 is disposed over the insulating structure 106 and the semiconductor substrate 104. The insulating structure 106 is buried between the semiconductor substrate 104 and the semiconductor layer 108. The semiconductor layer 108 may be any type of semiconductor material, for example, silicon (Si), germanium (Ge), silicon-germanium (SiGe), gallium arsenide (GaAs), some other semiconductor material, or a combination of the foregoing. The semiconductor layer 108 may be doped or intrinsic. In some embodiments, portions of the semiconductor layer 108 may be doped, while other portions of the semiconductor layer 108 are intrinsic.

In some embodiments, the semiconductor layer 108 is silicon (Si). In other embodiments, the semiconductor layer 108 is silicon germanium (SiGe). In some embodiments, the semiconductor layer 108 and the semiconductor substrate 104 are a same semiconductor material (e.g., Si). In other embodiments, the semiconductor layer 108 is a different semiconductor material than the semiconductor substrate 104 (e.g., the semiconductor layer 108 is SiGe and the semiconductor substrate 104 is Si).

The insulating structure 106 has a first region 110 and a second region 112. The insulating structure 106 has a first thickness 114 in the first region 110 of the insulating structure 106. The insulating structure 106 has a second thickness 116 different than (e.g., less than) the first thickness 114 in the second region 112 of the insulating structure 106. In some embodiments, an edge (e.g., a side) of the first region 110 and a first edge (e.g., a first side) of the second region 112 are defined by a point in which the thickness of the insulating structure 106 changes from the first thickness 114 to the second thickness 116.

The semiconductor layer 108 has a third thickness 118 over (e.g., directly over) the first region 110 of the insulating structure 106. The semiconductor layer 108 has a fourth thickness 120 that is different than (e.g., greater than) the third thickness 118 over (e.g., directly over) the second region 112 of the insulating structure 106. In some embodiments, the portion of the semiconductor layer 108 that is disposed directly over the first region 110 of the insulating structure 106 is referred to as a first region of the semiconductor layer 108, and the portion of the semiconductor layer 108 that is disposed directly over the second region 112 of the insulating structure 106 is referred to as a second region of the semiconductor layer 108. As such, it will be appreciated that the first region of the semiconductor layer 108 has the third thickness 118 and the second region of the semiconductor layer 108 has the fourth thickness 120. For clarity in the figures, the first region of the semiconductor layer 108 and the second region of the semiconductor layer 108 are not labeled. Because the first region of the semiconductor layer 108 has the third thickness 118 and the second region of the semiconductor layer 108 has the fourth thickness 120, multiple semiconductor devices (e.g., insulated gate field-effect transistors (IGFETs)) that benefit from different thicknesses of the semiconductor layer 108 may be integrated into the SOI substrate 102.

More specifically, as shown in the cross-sectional view 100 of FIG. 1, the IC 101 comprises a plurality of semiconductor devices 122. For example, the IC 101 comprises a first semiconductor device 122a and a second semiconductor device 122b. The first semiconductor device 122a and the second semiconductor device 122b are laterally spaced.

The first semiconductor device 122a comprises a pair of first source/drain regions 126 disposed in the semiconductor layer 108. The first source/drain regions 126 are laterally spaced. In some embodiments, the first source/drain regions 126 are disposed over (e.g., directly over) the first region 110 of the insulating structure 106. The first source/drain regions 126 are portions of the semiconductor layer 108 having a first doping type (e.g., n-type). In some embodiments, portions of the semiconductor layer 108 adjoining the first source/drain regions 126 may have a second doping type (e.g., p-type) opposite the first doping type. In other embodiments, the first region of the semiconductor layer 108 adjoining the first source/drain regions 126 may be intrinsic.

The first semiconductor device 122a comprises a gate dielectric 128 and a conductive gate electrode 130. The gate dielectric 128 is disposed over the semiconductor layer 108 and between the first source/drain regions 126. The conductive gate electrode 130 overlies the gate dielectric 128. In some embodiments, the gate dielectric 128 and the conductive gate electrode 130 are collectively referred to as a gate stack. In some embodiments, the conductive gate electrode 130 comprises polysilicon. In such embodiments, the gate dielectric 128 may comprise or be, for example, an oxide (e.g., SiO$_2$). In other embodiments, the conductive gate electrode 130 may be or comprise a metal, such as aluminum (Al), copper (Cu), titanium (Ti), tantalum (Ta), tungsten (W), molybdenum (Mo), cobalt (Co), or the like. In such embodiments, the gate dielectric 128 may be or comprise a high-k dielectric material, such as hafnium oxide (HfO), tantalum oxide (TaO), hafnium silicon oxide (HfSiO), hafnium tantalum oxide (HfTaO), aluminum oxide (AIO), zirconium oxide (ZrO), or the like.

The second semiconductor device 122b comprises a pair of second source/drain regions 132 disposed in the semiconductor layer 108. The second source/drain regions 132 are laterally spaced. In some embodiments, the second source/drain regions 132 are disposed over (e.g., directly over) the second region 112 of the insulating structure 106. The second source/drain regions 132 are portions of the semiconductor layer 108 having the first doping type. In some embodiments, portions of the semiconductor layer 108 adjoining the second source/drain regions 132 may have the second doping type. In other embodiments, the portions of the semiconductor layer 108 adjoining the second source/drain regions 132 may be intrinsic.

The second semiconductor device 122b comprises a gate dielectric 134 and a conductive gate electrode 136. The gate dielectric 134 is disposed over the semiconductor layer 108 and between the second source/drain regions 132. The conductive gate electrode 136 overlies the gate dielectric 134. In some embodiments, the gate dielectric 134 and the conductive gate electrode 136 are collectively referred to as a gate stack. In some embodiments, the conductive gate electrode 136 comprises polysilicon. In such embodiments, the gate dielectric 134 may comprise or be, for example, an oxide (e.g., SiO$_2$). In other embodiments, the conductive gate electrode 136 may be or comprise a metal, such as aluminum (Al), copper (Cu), titanium (Ti), tantalum (Ta), tungsten (W), molybdenum (Mo), cobalt (Co), or the like. In such embodiments, the gate dielectric 134 may be or comprise a high-k dielectric material, such as hafnium oxide (HfO), tantalum oxide (TaO), hafnium silicon oxide (HfSiO), hafnium tantalum oxide (HfTaO), aluminum oxide (AIO), zirconium oxide (ZrO), or the like.

In some embodiments, the third thickness 118 is between about 60 angstroms (Å) and about 120 Å. In such embodiments, the first region of the semiconductor layer 108 may be said to be a fully-depleted semiconductor-on-insulator (FDSOI) region of the SOI substrate 102. In further embodiments, the fourth thickness 120 is greater than about 1000 Å. In such embodiments, the second region of the first region of the semiconductor layer 108 may be said to be a bulk-like SOI region of the SOI substrate 102.

The first semiconductor device 122a benefits from the first region of the semiconductor layer 108 having the third thickness, while the second semiconductor device 122b benefits from the second region of the first region of the semiconductor layer 108 having the fourth thickness 120. For example, in some embodiments, the first semiconductor device 122a may be a logic device and the second semiconductor device 122b may be a power device or an input/output (I/O) device. In such embodiments, because the third thickness 118 is between about 60 Å and about 120 Å, the first semiconductor device 122a may have low substrate leakage and high switching speeds (e.g., due to the first semiconductor device 122a having the benefits of being disposed in the FDSOI region of the SOI substrate 102). Because the fourth thickness is greater than about 1000 Å, the second semiconductor device 122b may have good threshold voltage control (e.g., due to the second semiconductor device 122b having the benefits of being disposed in the bulk-like SOI region of the SOI substrate 102). Accordingly, the performance of the IC 101 may be improved (e.g., lower power consumption, higher switching speed, etc.) due to the semiconductors layer 108 having different thicknesses (e.g., by leveraging the benefits the different thicknesses of the semiconductor layer 108 provide to semiconductor devices with different functions (e.g., logic devices versus power devices)).

Figure 2:
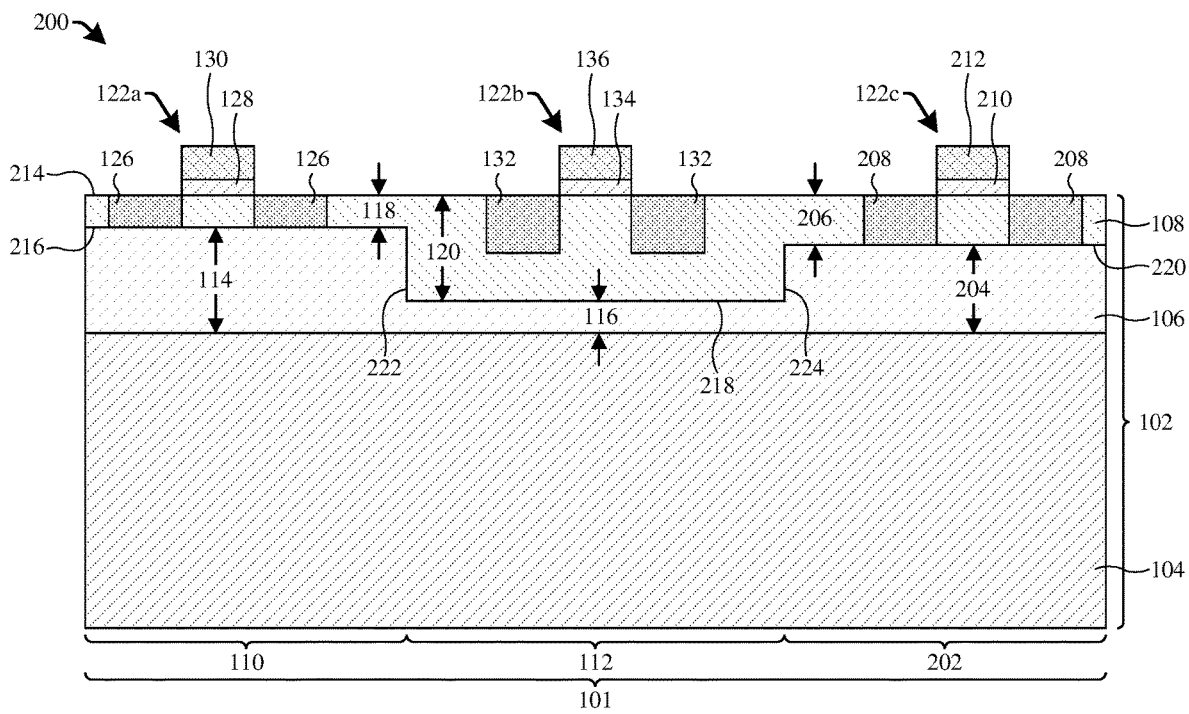
FIG. 2 illustrates a cross-sectional view of some other embodiments of the IC of FIG. 1.

FIG. 2 illustrates a cross-sectional view 200 of some other embodiments of the IC 101 of FIG. 1.

As shown in the cross-sectional view 200 of FIG. 2, the insulating structure 106 has the first region 110, the second region 112, and a third region 202. The insulating structure 106 structure has a fifth thickness 204 in the third region 202 of the insulating structure 106. The fifth thickness 204 is different than both the first thickness 114 and the second thickness 116. For example, the fifth thickness 204 is less than the first thickness 114 and greater than the second thickness 116.

The semiconductor layer 108 has a sixth thickness 206 over (e.g., directly over) the third region 202 of the insulating structure 106. In some embodiments, the portion of the semiconductor layer 108 that is disposed directly over the first region 110 of the insulating structure 106 is referred to as a first region of the semiconductor layer 108, the portion of the semiconductor layer 108 that is disposed directly over the second region 112 of the insulating structure 106 is referred to as a second region of the semiconductor layer 108, and the portion of the semiconductor layer 108 that is disposed directly over the third region 202 of the insulating structure 106 is referred to as a third region of the semiconductor layer 108. As such, it will be appreciated that the third region of the semiconductor layer 108 has the sixth thickness 206.

In some embodiments, the IC 101 comprises the first semiconductor device 122a, the second semiconductor device 122b, and a third semiconductor device 122c. The first semiconductor device 122a, the second semiconductor device 122b, and the third semiconductor device 122c are laterally spaced from one another. The third semiconductor device 122c comprises a pair of third source/drain regions 208 disposed in the semiconductor layer 108. The third source/drain regions 208 are laterally spaced. In some embodiments, the third source/drain regions 208 are disposed over (e.g., directly over) the third region 202 of the insulating structure 106. The third source/drain regions 124 are portions of the semiconductor layer 108 having the first doping type. In some embodiments, portions of the semiconductor layer 108 adjoining the third source/drain regions 208 may have the second doping type or may be intrinsic.

The third semiconductor device 122c comprises a gate dielectric 210 and a conductive gate electrode 212. The gate dielectric 210 is disposed over the semiconductor layer 108 and between the third source/drain regions 208. The conductive gate electrode 212 overlies the gate dielectric 210. In some embodiments, the gate dielectric 210 and the conductive gate electrode 212 are collectively referred to as a gate stack. In some embodiments, the gate dielectric 128, the gate dielectric 134, and the gate dielectric 210 are each vertically spaced from an upper surface of the semiconductor substrate 104 by the same distance.

In some embodiments, the conductive gate electrode 212 comprises polysilicon. In such embodiments, the gate dielectric 210 may comprise or be, for example, an oxide (e.g., $SiO_2$), a nitride (e.g., SiN), or the like. In other embodiments, the conductive gate electrode 212 may be or comprise a metal, such as aluminum (Al), copper (Cu), titanium (Ti), tantalum (Ta), tungsten (W), molybdenum (Mo), cobalt (Co), or the like. In such embodiments, the gate dielectric 210 may be or comprise a high-k dielectric material, such as hafnium oxide (HfO), tantalum oxide (TaO), hafnium silicon oxide (HfSiO), hafnium tantalum oxide (HfTaO), aluminum oxide (AlO), zirconium oxide (ZrO), or the like.

In some embodiments, the sixth thickness 206 is between about 500 Å and about 1000 Å. In such embodiments, the third region of the semiconductor layer 108 may be said to be a partially-depleted semiconductor-on-insulator (PDSOI) region of the SOI substrate 102. The third semiconductor device 122c benefits from the third region of the semiconductor layer 108 having the sixth thickness 206. For example, in some embodiments, the third semiconductor device 122c may be a radio frequency (RF) switching device. In such embodiments, because the sixth thickness 206 is between about 500 Å and about 1000 Å, the third semiconductor device 122c may have a low capacitance when the third semiconductor device 122c is in an off state (e.g., $C_{OFF}$). Thus, because the first region of the semiconductor layer 108 has the third thickness 118, the second region of the semiconductor layer 108 has the fourth thickness 120, and the third region of the semiconductor layer 108 has the sixth thickness 206, even more semiconductor devices that benefit from different thicknesses of the semiconductor layer 108 may be integrated onto the SOI substrate 102. Accordingly, the performance of the IC 101 may be further improved due to the semiconductor layer 108 having different thicknesses.

The semiconductor layer 108 has an upper surface 214. In some embodiments, the upper surface 214 of the semiconductor layer 108 is substantially planar. The substantially planar upper surface 214 of the semiconductor layer 108 may further improve the integration of the first semiconductor device 122a, the second semiconductor device 122b, and the third semiconductor device 122c onto the SOI substrate 102 by enhancing the process window for forming the IC 101. For example, another challenge with integrating the semiconductor devices 122 onto the SOI substrate 102 is damage to the semiconductor devices 122 during a planarization process (e.g., damage to the semiconductor devices 122 caused by dishing from a chemical-mechanical polishing (CMP) process).

The third thickness 118 is a distance from the upper surface 214 of the semiconductor layer 108 to a first upper surface 216 of the insulating structure 106. In some embodiments, the first upper surface 216 of the insulating structure 106 is substantially planar. The fourth thickness 120 is a distance from the upper surface 214 of the semiconductor layer 108 to a second upper surface 218 of the insulating structure 106. In some embodiments, the second upper surface 218 of the insulating structure 106 is substantially planar. The sixth thickness 206 is a distance from the upper surface 214 of the semiconductor layer 108 to a third upper surface 220 of the insulating structure 106. In some embodiments, the third upper surface 220 of the insulating structure 106 is substantially planar.

In some embodiments, an edge (e.g., a side) of the first region 110 of the insulating structure 106 and a first edge (e.g., a first side) of the second region 112 of the insulating structure 106 are defined by a point in which the thickness of the insulating structure 106 changes from the first thickness 114 to the second thickness 116. For example, a first sidewall 222 of the insulating structure 106 extends continuously from the first upper surface 216 of the insulating structure 106 to the second upper surface 218 of the insulating structure 106. As such, in some embodiments, the first sidewall 222 of the insulating structure 106 defines the edge of the first region 110 and the first edge of the second region 112. In further embodiments, the first sidewall 222 of the insulating structure 106 is substantially vertical, as shown in the cross-sectional view 200 of FIG. 2. In other embodiments, the first sidewall 222 of the insulating structure 106 may be angled and/or rounded.

In some embodiments, a second edge (e.g., a second side) of the second region 112 of the insulating structure 106 opposite the first edge and an edge (e.g., a side) of the third region 202 of the insulating structure 106 are defined by a point in which the thickness of the insulating structure 106 changes from the second thickness 116 to the fifth thickness 204. For example, a second sidewall 224 of the insulating structure 106 extends continuously from the second upper surface 218 of the insulating structure 106 to the third upper surface 220 of the insulating structure 106. As such, in some embodiments, the second sidewall 224 of the insulating structure 106 defines the second edge of the second region 112 of the insulating structure 106 and the edge of the third region 202 of the insulating structure 106. In further embodiments, the second sidewall 224 of the insulating structure 106 is substantially vertical, as shown in the cross-sectional view 200 of FIG. 2. In other embodiments, the second sidewall 224 of the insulating structure 106 may be angled and/or rounded.

In some embodiments, the second region 112 of the insulating structure 106 is disposed between the first region 110 of the insulating structure 106 and the third region 202 of the insulating structure 106. It will be appreciated that the first region 110, the second region 112, and the third region 202 may be situated in any configuration (e.g., the first region 110 (or the third region 202) may be disposed between the second region 112 and the third region 202 (or the first region 110)). It will also be appreciated that the insulating structure 106 may comprise any combination of the first region 110, the second region 112, and the third region 202. For example, the insulating structure 106 may only comprise the first region 110 and the third region 202, the insulating structure 106 may only comprise the first region 110 and the second region 112, the insulating structure 106 may only comprise the second region 112 and the third region 202, the insulating structure 106 may comprise the first region 110, the second region 112, and the third region 202, and so forth. It will also be appreciated that the insulating structure 106 is not limited to only three regions having different thicknesses, but rather the insulating structure 106 may comprise any number of regions having different distinct thickness.

Figure 3:
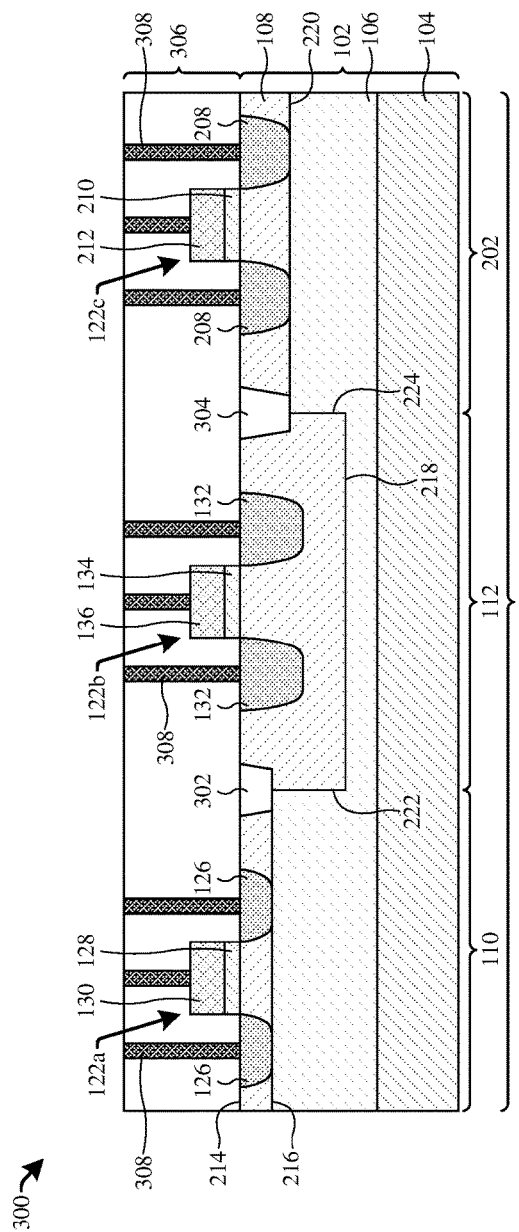
FIG. 3 illustrates a cross-sectional view of some other embodiments of the IC of FIG. 1.

FIG. 3 illustrates a cross-sectional view 300 of some other embodiments of the IC 101 of FIG. 1.

As shown in the cross-sectional view 300 of FIG. 3, a first isolation structure 302 and a second isolation structure 304 are disposed in the semiconductor layer 108. The first isolation structure 302 (e.g., a shallow trench isolation (STI) structure) is disposed between the first semiconductor device 122a and the second semiconductor device 122b. The second isolation structure 304 (e.g., STI structure) is disposed between the second semiconductor device 122b and the third semiconductor device 122c. The first isolation structure 302 and the second isolation structure 304 extend into the semiconductor layer 108 from the upper surface 214 of the semiconductor layer 108. In some embodiments, the first isolation structure 302 and the second isolation structure 304 may be or comprise, for example, an oxide (e.g., SiO$_2$), a nitride (e.g., SiN), an oxy-nitride (e.g., (SiON), a carbide (e.g., silicon carbide (SiC)), some other dielectric material, or a combination of the foregoing.

In some embodiments, the first isolation structure 302 is disposed over (e.g., directly over) the edge of the first region 110 of the insulating structure 106 and the first edge of the second region 112 of the insulating structure 106. For example, the first isolation structure 302 is disposed over (e.g., directly over) the first sidewall 222 of the insulating structure 106. In some embodiments, the second isolation structure 304 is disposed over (e.g., directly over) the second edge of the second region 112 and the edge of the third region 202 of the insulating structure 106. For example, the second isolation structure 304 is disposed over (e.g., directly over) the second sidewall 224 of the insulating structure 106.

In some embodiments, the first isolation structure 302 extends vertically into the semiconductor layer 108 a first distance, and the second isolation structure 304 extends vertically into the semiconductor layer 108 a second distance different than (e.g., greater than) the first distance. The first isolation structure 302 may extend into the semiconductor layer 108 and contact the first upper surface 216 of the insulating structure 106. The second isolation structure 304 may extend into the semiconductor layer 108 and contact the third upper surface 220 of the insulating structure 106.

An interlayer dielectric (ILD) structure 306 is disposed over the semiconductor layer 108 and the semiconductor devices 122. The ILD structure 306 comprises one or more stacked ILD layers, which may respectively comprise a low-k dielectric (e.g., a dielectric material with a dielectric constant less than about 3.9), an oxide (e.g., SiO$_2$), an oxy-nitride (e.g., SiON), doped silicon dioxide (e.g., carbon doped silicon dioxide), borosilicate glass (BSG), phosphoric silicate glass (PSG), borophosphosilicate glass (BPSG), fluorinated silicate glass (FSG), or the like A plurality of conductive contacts 308 (e.g., metal contacts) are disposed in the ILD structure 306 and over the semiconductor layer 108. The conductive contacts 308 are electrically coupled to and vertically extend from the gate electrodes of the semiconductor devices 122 (e.g., the conductive gate electrode 130, the conductive gate electrode 136, and the conductive gate electrode 212), the first source/drain regions 126, the second source/drain regions 132, and the third source/drain regions 208. The conductive contacts 308 may be or comprise, for example, tungsten (W), copper (Cu), aluminum (Al), some other conductive material, or a combination of the foregoing.

Also shown in the cross-sectional view 300 of FIG. 3, the first source/drain regions 126, the second source/drain regions 132, and the third source/drain regions 208 extend into the semiconductor layer 108 from the upper surface 214 of the semiconductor layer 108. In some embodiments, the first source/drain regions 126 extend vertically into the semiconductor layer 108 a third distance. In some embodiments, the second source/drain regions 132 extend vertically into the semiconductor layer 108 a fourth distance different than (e.g., greater than) the third distance. In some embodiments, the third source/drain regions 208 extend vertically into the semiconductor layer 108 a fifth distance different than both the third distance and the fourth distance. For example, the fifth distance is greater than the third distance and less than the fourth distance.

The first source/drain regions 126 may extend vertically from the upper surface 214 of the insulating structure 106 to contact the first upper surface 216 of the insulating structure 106, as shown in the cross-sectional view 300 of FIG. 3. In some embodiments, the second source/drain regions 132 extend vertically into the insulating structure 106 and are vertically spaced from the second upper surface 218 of the insulating structure 106. In some embodiments, the third source/drain regions 208 extend vertically from the upper surface 214 of the insulating structure 106 to contact the third upper surface 220 of the insulating structure 106.

Figure 4:
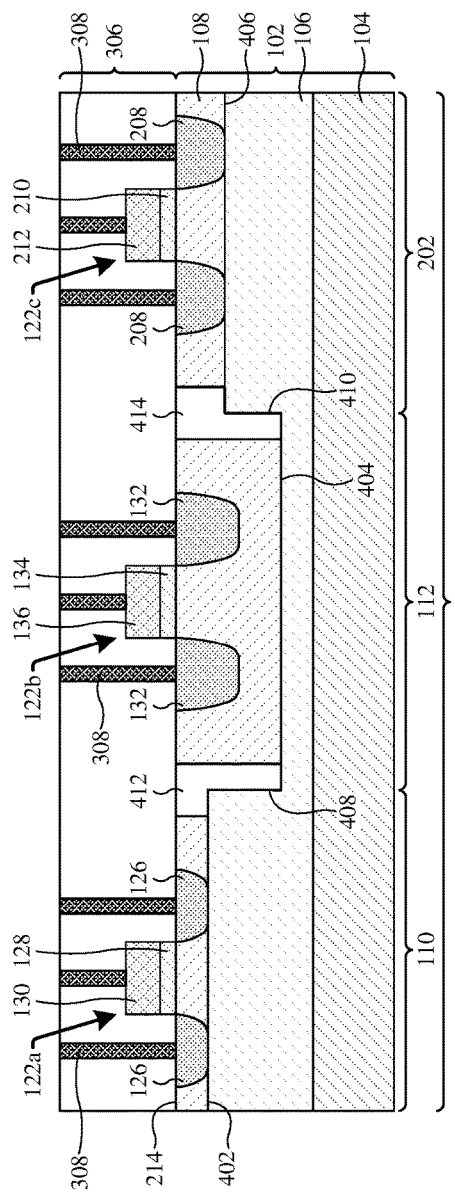
FIG. 4 illustrates a cross-sectional view of some other embodiments of the IC of FIG. 1.

FIG. 4 illustrates a cross-sectional view 400 of some other embodiments of the IC 101 of FIG. 1.

As shown in the cross-sectional view 400 of FIG. 4, the semiconductor layer 108 has a first lower surface 402, a second lower surface 404, a third lower surface 406, a first sidewall 408, and a second sidewall 410. The first lower surface 402 of the semiconductor layer 108 engages the first upper surface 216 (see, FIG. 3) of the insulating structure 106. The second lower surface 404 of the semiconductor layer 108 engages the second upper surface 218 (see, FIG. 3) of the insulating structure 106. The third lower surface 406 of the semiconductor layer 108 engages the third upper surface 220 (see, FIG. 3) of the insulating structure 106. The first sidewall 408 of the semiconductor layer 108 engages the first sidewall 222 (see, FIG. 3) of the insulating structure 106. The second sidewall 410 of the semiconductor layer 108 engages the second sidewall 224 (see, FIG. 3) of the insulating structure 106.

Also shown in the cross-sectional view 400 of FIG. 4, a third isolation structure 412 and a fourth isolation structure 414 are disposed in the semiconductor layer 108. The third isolation structure 412 (e.g., a deep trench isolation (DTI) structure) is disposed between the first semiconductor device 122a and the second semiconductor device 122b. The fourth isolation structure 414 (e.g., DTI structure) is disposed between the second semiconductor device 122b and the third semiconductor device 122c. The third isolation structure 412 and the fourth isolation structure 414 extend into the semiconductor layer 108 from the upper surface 214 of the semiconductor layer 108. In some embodiments, the third isolation structure 412 and the fourth isolation structure 414 may be or comprise, for example, an oxide (e.g., SiO$_2$), a nitride (e.g., SiN), an oxy-nitride (e.g., silicon oxy-nitride (SiON)), a carbide (e.g., silicon carbide (SiC)), some other dielectric material, or a combination of the foregoing.

In some embodiments, the third isolation structure 412 is disposed over (e.g., directly over) the edge of the first region 110 of the insulating structure 106 and the first edge of the second region 112 of the insulating structure 106. For example, the third isolation structure 412 is disposed over (e.g., directly over) the first sidewall 408 of the semiconductor layer 108. In some embodiments, the fourth isolation structure 414 is disposed over (e.g., directly over) the second edge of the second region 112 and the edge of the third region 202 of the insulating structure 106. For example, the fourth isolation structure 414 is disposed over (e.g., directly over) the second sidewall 410 of the semiconductor layer 108.

In some embodiments, the third isolation structure 412 extends vertically into the semiconductor layer 108 and contacts both the first upper surface 216 (see, FIG. 3) of the insulating structure 106 and the second upper surface 218 (see, FIG. 3) of the insulating structure 106. In further embodiments, the third isolation structure 412 extends continuously along and contacts the first sidewall 222 (see, FIG. 3) of the insulating structure 106. In some embodiments, the fourth isolation structure 414 extends vertically into the semiconductor layer 108 and contacts both the third upper surface 220 (see, FIG. 3) of the insulating structure 106 and the second upper surface 218 (see, FIG. 3) of the insulating structure 106. In further embodiments, the fourth isolation structure 414 extends continuously along and contacts the second sidewall 224 (see, FIG. 3) of the insulating structure 106.

Figure 5:
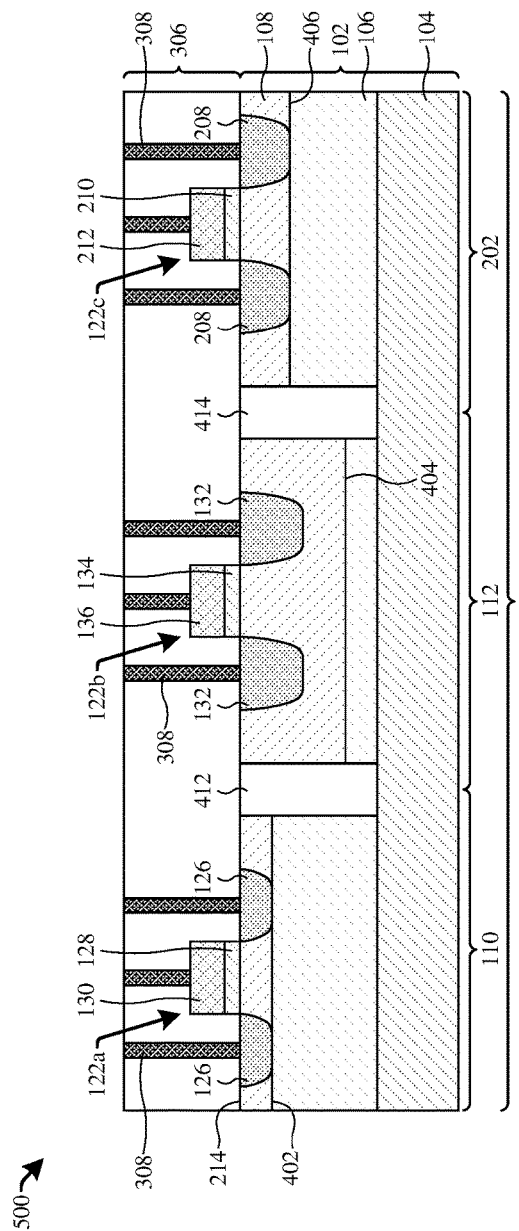
FIG. 5 illustrates a cross-sectional view of some other embodiments of the IC of FIG. 1.

FIG. 5 illustrates a cross-sectional view 500 of some other embodiments of the IC 101 of FIG. 1.

As shown in the cross-sectional view 500 of FIG. 5, the third isolation structure 412 may extend through (e.g., completely through) the semiconductor layer 108 and the insulating structure 106. In some embodiments, the third isolation structure 412 extends through the semiconductor layer 108 and the insulating structure 106 to contact (e.g., directly contact) the semiconductor substrate 104. In such embodiments, the first lower surface 402 of the semiconductor layer 108 is disposed on a first side of the third isolation structure 412 and the second lower surface 404 of the semiconductor layer 108 is disposed on a second side of the third isolation structure 412 opposite the first side of the third isolation structure 412.

The fourth isolation structure 414 may also extend through (e.g., completely through) the semiconductor layer 108 and the insulating structure 106. In some embodiments, the fourth isolation structure 414 extends through the semiconductor layer 108 and the insulating structure 106 to contact (e.g., directly contact) the semiconductor substrate 104. In such embodiments, the third lower surface 406 of the semiconductor layer 108 is disposed on a first side of the fourth isolation structure 414 and the second lower surface 404 of the semiconductor layer 108 is disposed on a second side of the fourth isolation structure 414 opposite the first side of the fourth isolation structure 414.

Figure 6:
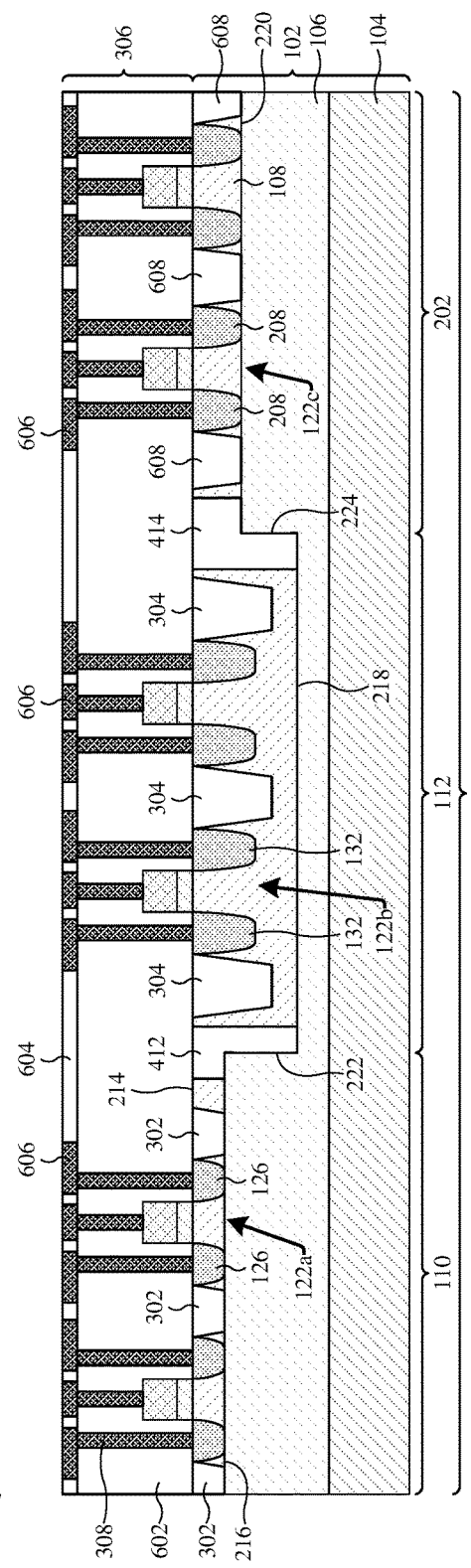
FIG. 6 illustrates a cross-sectional view of some other embodiments of the IC of FIG. 1.

FIG. 6 illustrates a cross-sectional view 600 of some other embodiments of the IC 101 of FIG. 1.

As shown in the cross-sectional view 600 of FIG. 6, the first semiconductor device 122a is one of a first plurality of semiconductor devices that are disposed over (e.g., directly over) the first region 110 of the insulating structure 106. In some embodiments, each of the first plurality of semiconductor devices comprise substantially the same features (e.g., structural features) as the first semiconductor device 122a. The second semiconductor device 122b is one of a second plurality of semiconductor devices that are disposed over (e.g., directly over) the second region 112 of the insulating structure 106. In some embodiments, each of the second plurality of semiconductor devices comprise substantially the same features (e.g., structural features) as the second semiconductor device 122b. The third semiconductor device 122c is one of a third plurality of semiconductor devices that are disposed over (e.g., directly over) the second region 112 of the insulating structure 106. In some embodiments, each of the third plurality of semiconductor devices comprise substantially the same features (e.g., structural features) as the third semiconductor device 122c.

The ILD structure 306 may comprise a first ILD layer 602 and a second ILD layer 604. The plurality of conductive contacts 308 are disposed in the first ILD layer 602. In some embodiments, the first ILD layer 602 has a substantially planar upper surface. In further embodiments, the upper surface of the first ILD layer 602 extends laterally in parallel with an upper surface of the semiconductor layer 108 and/or an upper surface of the semiconductor substrate 104.

The second ILD layer 604 overlies the first ILD layer 602 and the plurality of conductive contacts 308. A plurality of conductive lines 606 (e.g., metal lines) are disposed in the second ILD layer 604 and electrically coupled to the plurality of conductive contacts 308. The conductive lines 606 may be or comprise, for example, copper (Cu), aluminum (Al), gold (Au), silver (Ag), some other conductive material, or a combination of the foregoing. The conductive contacts 308 and the conductive lines 606 are part of an interconnect structure that is embedded in the ILD structure 306 and configured to electrically couple the semiconductor devices 122 of the IC 101 together in a predefined manner. Although not shown, it will be appreciated that any number of other conductive features (e.g., conductive lines and conductive vias) may be disposed over and electrically coupled to the conductive contacts 308 and the conductive lines 606.

Also shown in the cross-sectional view 600 of FIG. 6, the IC 101 comprises a first isolation structure 302, a second isolation structure 304, a third isolation structure 412, a fourth isolation structure 414, and a fifth isolation structure 608. The first isolation structure 302, the second isolation structure 304, the third isolation structure 412, the fourth isolation structure 414, and the fifth isolation structure 608 extend into the semiconductor layer 108 from the upper surface 214 of the semiconductor layer 108. The fifth isolation structure 608 may extend into the semiconductor layer 108 and contact (e.g., directly contact) the third upper surface 220 of the insulating structure 106. In other embodiments, the fifth isolation structure 608 may be vertically spaced from the third upper surface 220 of the insulating structure 106. In some embodiments, the first isolation structure 302, the second isolation structure 304, the third isolation structure 412, the fourth isolation structure 414, and the fifth isolation structure 608 may be or comprise, for example, an oxide (e.g., $SiO_2$), a nitride (e.g., SiN), an oxy-nitride (e.g., SiON), a carbide (e.g., SiC), some other dielectric material, or a combination of the foregoing.

In some embodiments, the first isolation structure 302 laterally surrounds the first plurality of semiconductor devices. The second isolation structure 304 may laterally surround the second plurality of semiconductor devices. The fifth isolation structure 608 may laterally surround the third plurality of semiconductor devices. In some embodiments, the third isolation structure 412 is disposed laterally between the first isolation structure 302 and the second isolation structure 304. In further embodiments, the fourth isolation structure 414 is disposed laterally between the second isolation structure 304 and the fifth isolation structure 608.

In some embodiments, the third isolation structure 412 is disposed over (e.g., directly over) an edge of the first region 110 of the insulating structure 106 and a first edge of the second region 112 of the insulating structure 106. In further embodiments, the fourth isolation structure 414 is disposed over (e.g., directly over) an edge of the third region 202 of the insulating structure 106 and a second edge of the second region 112 of the insulating structure 106 opposite the first edge of the second region 112. The first isolation structure 302 may be disposed over (e.g., directly over) the first region 110 of the insulating structure 106 and spaced from the edge of the first region 110 of the insulating structure 106. The second isolation structure 304 may be disposed over (e.g., directly over) the second region 112 of the insulating structure 106 and disposed between the first and second edges of the second region 112 of the insulating structure 106. The fifth isolation structure 608 may be disposed over (e.g., directly over) the third region 202 of the insulating structure 106 and spaced from the edge of the third region 202 of the insulating structure 106.

In some embodiments, the first isolation structure 302, the third isolation structure 412, the fourth isolation structure 414, and the fifth isolation structure 608 may extend through the semiconductor layer 108 to contact (e.g., directly contact) the insulating structure 106. In further embodiments, the second isolation structure 304 may be vertically spaced from the insulating structure 106. In other embodiments, the second isolation structure 304 may extend through the semiconductor layer 108 to contact (e.g., directly contact) the insulating structure 106. The first isolation structure 302, the second isolation structure 304, and the fifth isolation structure 608 may extend different distances into the semiconductor layer 108. For example, the first isolation structure 302 extends vertically into the semiconductor layer 108 a first distance, the fifth isolation structure 608 extends vertically into the semiconductor layer 108 a second distance different than (e.g., greater than) the first distance, and the second isolation structure 304 extends vertically into the semiconductor layer 108 a third distance different than (e.g., greater than) both the first distance and the second distance.

FIG. 7 illustrates a cross-sectional view 700 of some other embodiments of the IC 101 of FIG. 1.

As shown in the cross-sectional view 700 of FIG. 7, the insulating structure 106 comprises one or more dielectric layers 702 and one or more filler structures 704. For example, the insulating structure 106 comprises a first dielectric layer 702a, a second dielectric layer 702b, a first filler structure 704a, and a second filler structure 704b. The one or more dielectric layers 702 separate the one or more filler structures 704 from the semiconductor layer 108 and the semiconductor substrate 104. For example, the first dielectric layer 702a separates the first filler structure 704a and the second filler structure 704b from the semiconductor layer 108, and the second dielectric layer 702b separates the first filler structure 704a and the second filler structure 704b from the semiconductor substrate 104.

The first filler structure 704a may have a different thickness than the second filler structure 704b, as shown in the cross-sectional view 700 of FIG. 7. In other embodiments, the thickness of the first filler structure 704a may be substantially the same as the thickness of the second filler structure 704b. In some embodiments, the first dielectric layer 702a and the second dielectric layer 702b may have different thicknesses, as shown in the cross-sectional view 700 of FIG. 7. In other embodiments, the thickness of the first dielectric layer 702a may be substantially the same as the thickness of the second dielectric layer 702b.

In some embodiments, a bottom surface of the first filler structure 704a and a bottom surface of the second filler structure 704b may be co-planar. In further embodiments, the bottom surface of the first filler structure 704a may also be co-planar with a bottom surface of the first dielectric layer 702a. In yet further embodiments, the bottom surface of the first filler structure 704a may also be co-planar with a bottom surface of the semiconductor layer 108. An upper surface of the second filler structure 704b and an upper surface of the first filler structure 704a may be spaced vertically from the upper surface 214 of the semiconductor layer 108 by different distances. For example, as shown in the cross-sectional view 700 of FIG. 7, the upper surface of the second filler structure 704b is vertically spaced a greater distance from the upper surface 214 of the semiconductor layer 108 than the upper surface of the first filler structure 704a.

The second dielectric layer 702b may contact (e.g., directly contact) the first filler structure 704a, the second filler structure 704b, the first dielectric layer 702a, and the semiconductor substrate 104. The first dielectric layer 702a may contact (e.g., directly contact) the first filler structure 704a, the second filler structure 704b, the second dielectric layer 702b, and the semiconductor layer 108. In some embodiments, the one or more dielectric layers 702 may be or comprise, for example, an oxide (e.g., $SiO_2$), a nitride (e.g., SiN), an oxy-nitride (e.g., SiON), a carbide (e.g., SiC), some other dielectric material, or a combination of the foregoing. The one or more dielectric layers 702 may be or comprise a same material. More specifically, in some embodiments, the one or more dielectric layers 702 are silicon dioxide ($SiO_2$). In other embodiments, the first dielectric layer 702a may comprise a different dielectric material than the second dielectric layer 702b.

The one or more filler structures 704 may be or comprise, for example, a semiconductor material (e.g., silicon (Si), germanium (Ge), etc.), a dielectric material different than the dielectric material of the one or more dielectric layers 702, a ceramic, a high-k dielectric material, a low-k dielectric material, a polymer, some other filler material, or a combination of the foregoing. More specifically, in some embodiments, the one or more filler structures 704 are polysilicon. The one or more filler structures 704 may be or comprise a same material. In other embodiments, the first filler structure 704a may comprise a different material than the second filler structure 704b.

FIG. 8 illustrates a cross-sectional view 800 of some other embodiments of the IC 101 of FIG. 7.

As shown in the cross-sectional view 800 of FIG. 8, the insulating structure 106 comprises the one or more dielectric layers 702 and the one or more filler structures 704. For example, the insulating structure 106 comprises a first dielectric layer 702a, a second dielectric layer 702b, a third dielectric layer 702c, a first filler structure 704a, and a second filler structure 704b. The first dielectric layer 702a separates the first filler structure 704a from the semiconductor layer 108. The second dielectric layer 702b separates the second filler structure 704b from the semiconductor layer 108. The third dielectric layer 702c separates the first filler structure 704a, the second filler structure 704b, the first dielectric layer 702a, and the second dielectric layer 702b from the semiconductor substrate 104.

The second dielectric layer 702b may separate a portion of the first dielectric layer 702a from a portion of the third dielectric layer 702c. In some embodiments, the first dielectric layer 702a contacts (e.g., directly contacts) the semiconductor layer 108, the first filler structure 704a, and the second dielectric layer 702b. The first dielectric layer 702a may be spaced from the second filler structure 704b. The second dielectric layer 702b may contact (e.g., directly contact) the semiconductor layer 108, the first dielectric layer 702a, the second filler structure 704b, the first filler structure 704a, and the third dielectric layer 702c. In some embodiments, the third dielectric layer 702c contacts (e.g., directly contacts) the semiconductor substrate 104, the second filler structure 704b, and the second dielectric layer 702b. The third dielectric layer 702c may be spaced from the first filler structure 704a and/or the first dielectric layer 702a.

In some embodiments, a thickness of the third dielectric layer 702c may be substantially the same as the thickness of the second dielectric layer 702b and/or the thickness of the first dielectric layer 702a. In other embodiments, the thickness of the third dielectric layer 702c may be different than the thickness of the second dielectric layer 702b and/or the thickness of the first dielectric layer 702a. In some embodiments, a bottom surface of the first filler structure 704a and a bottom surface of the second filler structure 704b may be spaced vertically from the upper surface 214 of the semiconductor layer 108 by different distances. For example, as shown in the cross-sectional view 800 of FIG. 8, the bottom surface of the second filler structure 704b is vertically spaced a greater distance from the upper surface 214 of the semiconductor layer 108 than the bottom surface of the first filler structure 704a.

In some embodiments, the bottom surface of the first filler structure 704a is co-planar with a bottom surface of the first dielectric layer 702a. The bottom surface of the second filler structure 704b may be co-planar with a bottom surface of the second dielectric layer 702b. In some embodiments, the bottom surface of the first filler structure 704a and/or the bottom surface of the second filler structure 704b are disposed vertically between a bottommost surface of the semiconductor layer 108 and the semiconductor substrate 104. In other embodiments, the bottom surface of the first filler structure 704a and/or the bottom surface of the second filler structure 704b may be co-planar with a bottom surface of the semiconductor layer 108.

FIGS. 9-19 illustrates a series of cross-sectionals views 900-1900 of some embodiments of a method for forming an integrated chip (IC) comprising a SOI substrate having a semiconductor layer with different thicknesses. Although FIGS. 9-19 are described with reference to a method, it will be appreciated that the structures shown in FIGS. 9-19 are not limited to the method but rather may stand alone separate of the method.

Figure 9:
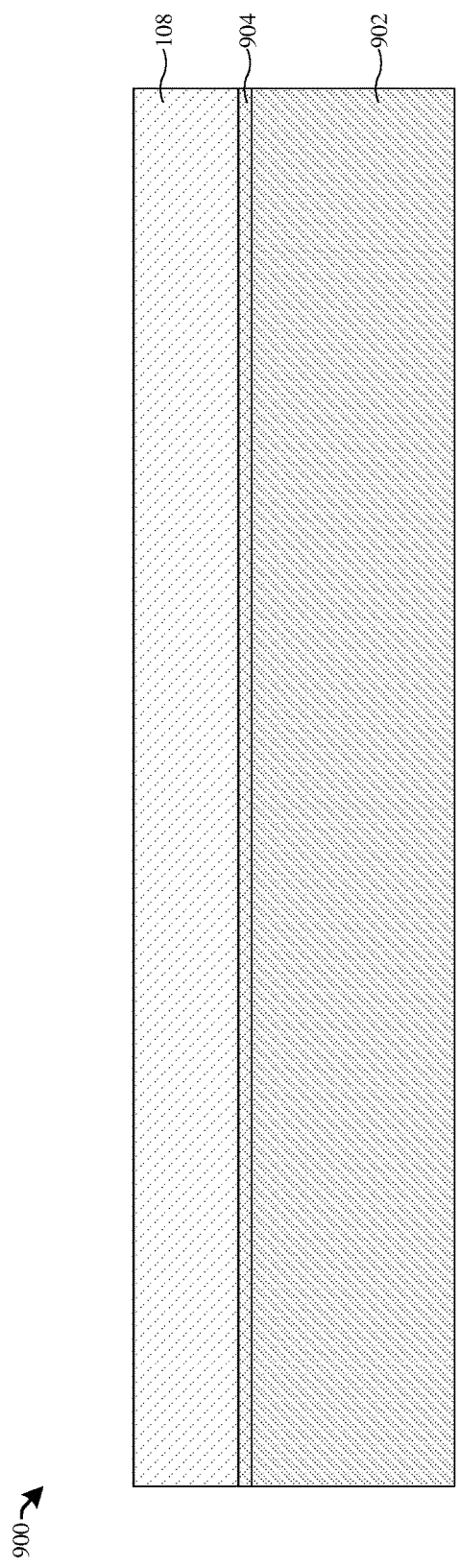

As shown in cross-sectional view 900 of FIG. 9, a semiconductor layer 108 is formed over a semiconductor substrate 902. In some embodiments, an etch stop layer 904 is disposed over the semiconductor substrate 902. In such embodiments, the semiconductor layer 108 is formed over the semiconductor substrate 902 and the etch stop layer 904. In other embodiments, the etch stop layer 904 is omitted. The etch stop layer 904 may have a thickness between about 10 Å and about 100 micrometers (um).

The semiconductor substrate 902 may be any type of semiconductor material, for example, silicon (Si), germanium (Ge), silicon-germanium (SiGe), gallium arsenide (GaAs), some other semiconductor material, or a combination of the foregoing. In some embodiments, the semiconductor substrate 902 is silicon (Si). In some embodiments, the semiconductor substrate 902 has a first doping type (e.g., p-type). In such embodiments, the semiconductor substrate 902 has a first doping concentration of first doping type dopants (e.g., p-type dopants, such as boron (B), gallium (Ga), or the like). The semiconductor substrate 902 may be heavily doped or lightly doped. In embodiments in which the semiconductor substrate 902 is heavily doped, the first doping concentration is greater than or equal to about $1 \times 10^{17}$ cm$^{-3}$. In embodiments in which the semiconductor substrate 902 is lightly doped, the first doping concentration is less than or equal to about $1 \times 10^{16}$ cm$^{-3}$.

The etch stop layer 904 may be any type of semiconductor material, for example, silicon (Si), germanium (Ge), silicon-germanium (SiGe), gallium arsenide (GaAs), some other semiconductor material, or a combination of the foregoing. In some embodiments, the etch stop layer 904 is silicon (Si). In such embodiments, the etch stop layer 904 may have the first doping type. In further such embodiments, the etch stop layer 904 has a second doping concentration of first doping type dopants. The second doping concentration is different than the first doping concentration. For example, in some embodiments, the second doping concentration may be greater than or equal to about $1 \times 10^{19}$ cm$^{-3}$ (e.g., the etch stop layer 904 is heavily doped) and the first doping concentration is less than or equal to about $1 \times 10^{16}$ cm$^{-3}$ (e.g., the semiconductor substrate 902 is lightly doped). Because the second doping concentration is different than the first doping concentration, an etching process subsequently performed on the semiconductor substrate 902 may stop on the etch stop layer 904.

In other embodiments, the etch stop layer 904 is silicon germanium (SiGe). In such embodiments, the etch stop layer 904 may comprises between about 20 percent and about 70 percent germanium (Ge) and between about 30 percent and about 80 percent silicon (Si). In further such embodiments, the semiconductor substrate 902 may be silicon (Si). Because the etch stop layer 904 is silicon germanium (SiGe) and the semiconductor substrate 902 is silicon (Si), an etching process subsequently performed on the semiconductor substrate 902 may stop on the etch stop layer 904.

In some embodiments, a process for forming the semiconductor layer 108 comprises performing an epitaxial process to grow the semiconductor layer 108 on the etch stop layer 904. The epitaxial process comprises growing a semiconductor material (e.g., Si) from the etch stop layer 904, thereby forming the semiconductor layer 108. The epitaxial process may be, for example, vapor-phase epitaxy (VPE), molecular-beam epitaxy (MBE), liquid-phase epitaxy (LPE), solid-phase epitaxy (SPE), reduced pressure chemical vapor deposition (RP-CVD) epitaxy, metalorganic vapor phase epitaxy (MOVPE), some other epitaxial process, or a combination of the foregoing. It will be appreciated that, in embodiments in which the etch stop layer 904 is omitted, the semiconductor layer 108 may be grown on the semiconductor substrate 902.

In some embodiments, the semiconductor layer 108 is formed with the first doping type. In such embodiments, the semiconductor layer 108 is doped with first doping type dopants (e.g., p-type dopants, such as boron (B), gallium (Ga), or the like), such that the semiconductor layer 108 has a third doping concentration of the first doping type dopants. The third doping concentration may be less than or equal to about $1 \times 10^{16}$ cm$^{-3}$ (e.g., the semiconductor layer 108 is lightly doped). The semiconductor layer 108 may be during the epitaxial process. In other words, the semiconductor layer 108 is in-situ doped during the epitaxial process. In other embodiments, the semiconductor layer 108 may be doped after the semiconductor layer 108 is formed, for example, by an implantation process (e.g., blanket ion implantation), a diffusion process, or the like.

In some embodiments, the third doping concentration may be substantially the same as the first doping concentration. In other embodiments, the third doping concentration is different than the first doping concentration. For example, the third doping concentration is less than or equal to about $1 \times 10^{16}$ cm$^{-3}$ and the first doping concentration is greater than or equal to about $1 \times 10^{17}$ cm$^{-3}$. Because the third doping concentration is different than the first doping concentration, an etching process subsequently performed on the semiconductor substrate 902 may stop on the semiconductor layer 108 (e.g., in embodiments in which the etch stop layer 904 is omitted and the semiconductor layer 108 is grown on the semiconductor substrate 902).

Figure 10:
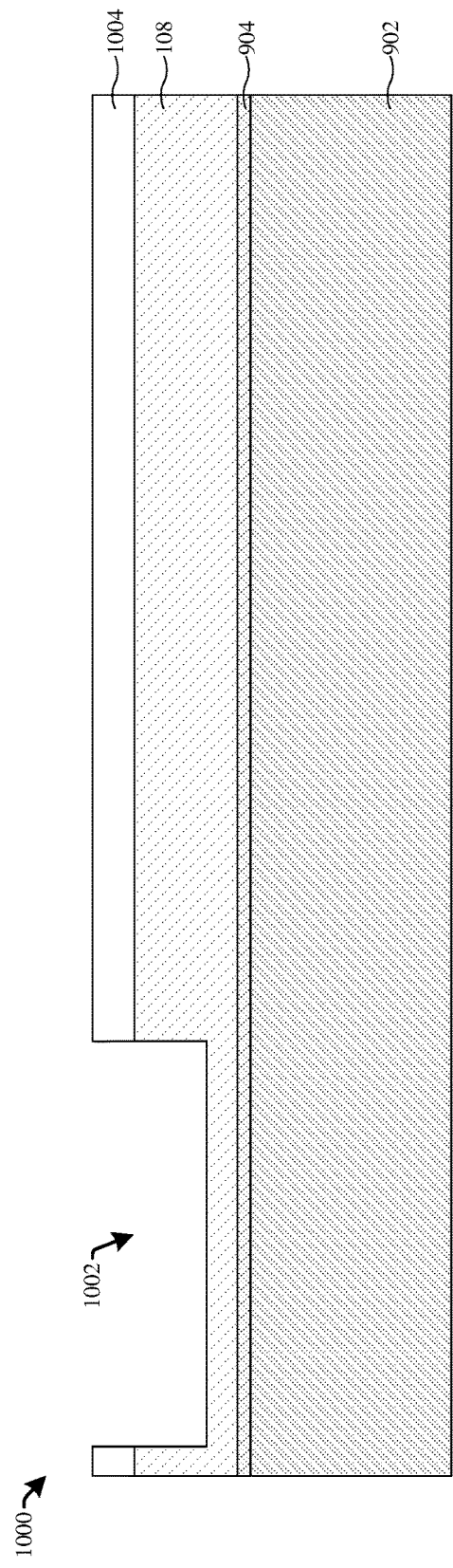

As shown in the cross-sectional view 1000 of FIG. 10, a first recess 1002 is formed in the semiconductor layer 108. In some embodiments, the first recess 1002 is formed extending vertically into the semiconductor layer 108 a first depth. The first recess 1002 may be formed with substantially straight sidewalls, as shown in the cross-sectional view 1000 of FIG. 10. In other embodiments, the first recess 1002 may be formed with angled and/or rounded sidewalls. In further embodiments, the first recess 1002 may be formed with a substantially planar bottom surface.

In some embodiments, a process for forming the first recess 1002 comprises forming a first patterned masking layer 1004 (e.g., positive/negative photoresist, a hardmask, etc.) over the semiconductor layer 108. The first patterned masking layer 1004 may be formed by forming a masking layer (not shown) on the semiconductor layer 108 (e.g., via a spin-on process), exposing the masking layer to a pattern (e.g., via a lithography process, such as photolithography, extreme ultraviolet lithography, or the like), and developing the masking layer, thereby forming the first patterned masking layer 1004. Thereafter, with the first patterned masking layer 1004 in place, an etching process is performed on the semiconductor layer 108 to selectively etch the semiconductor layer 108 according to the first patterned masking layer 1004. The etching process removes unmasked portions of the semiconductor layer 108, thereby forming the first recess 1002. In some embodiments, the etching process may be, for example, a wet etching process, a dry etching process, a reactive ion etching (RIE) process, some other etching process, or a combination of the foregoing. In further embodiments, the first patterned masking layer 1004 is subsequently stripped away.

Figure 11A:
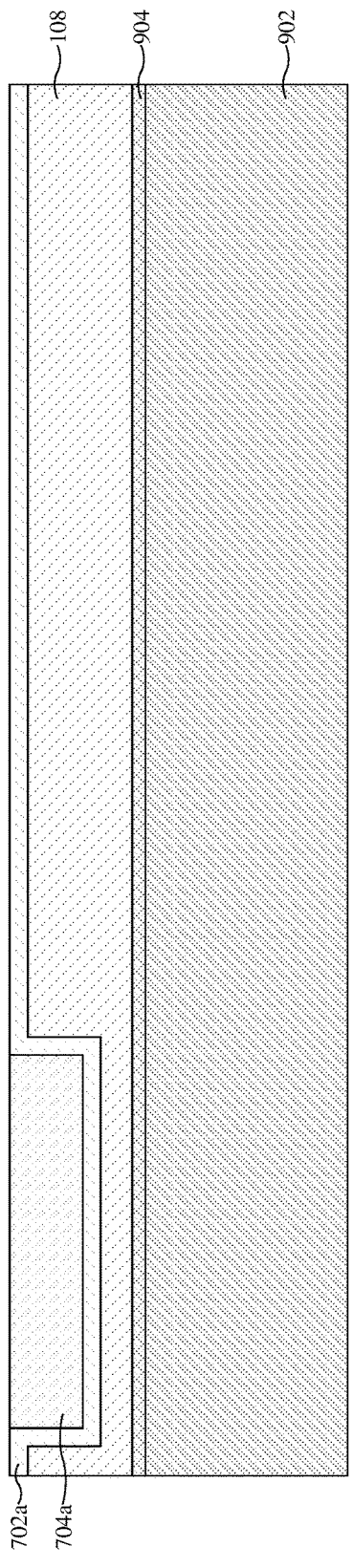

As shown in the cross-sectional view 1100a of FIG. 11A, a first dielectric layer 702a is formed over the semiconductor layer 108 and in the first recess 1002 (see, FIG. 10). In some embodiments, the first dielectric layer 702a is formed lining the semiconductor layer 108 and the first recess 1002. In further embodiments, the first dielectric layer 702a is formed as a conformal layer.

In some embodiments, a process for forming the first dielectric layer 702a comprises removing (e.g., stripping away) the first patterned masking layer 1004 (see, FIG. 10). Thereafter, a first dielectric material is grown or deposited on the semiconductor layer 108, thereby forming the first dielectric layer 702a. The first dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. More specifically, in some embodiments, the first dielectric material is silicon dioxide ($SiO_2$). The first dielectric material may be deposited or grown by, for example, chemical vapor deposition (CVD), physical vapor deposition (PVD), atomic layer deposition (ALD), thermal oxidation, some other deposition or growth process, or a combination of the foregoing.

Also shown in the cross-sectional view 1100a of FIG. 11A, a first filler structure 704a is formed over the first dielectric layer 702a and in the first recess 1002. In some embodiments, the first filler structure 704a is formed extending vertically out of the first recess 1002 by a non-zero distance. In further embodiments, the first filler structure 704a is formed with an upper surface that is co-planar with an upper surface of the first dielectric layer 702a.

In some embodiments, a process for forming the first filler structure 704a comprises depositing a first filler material layer (not shown) over the first dielectric layer 702a and in the first recess 1002. The first filler material layer may be or comprise, for example, a semiconductor material (e.g., silicon (Si), germanium (Ge), etc.), a dielectric material different than the dielectric material of the first dielectric layer 702a, a ceramic, a high-k dielectric material, a low-k dielectric material, a polymer, some other filler material, or a combination of the foregoing. More specifically, in some embodiments, the first filler material layer is polysilicon. The first filler material layer may be deposited by, for example, CVD, PVD, ALD, sputtering, some other deposition process, or a combination of the foregoing.

Thereafter, an etching process is performed on the first filler material layer to remove an upper portion of the first filler material layer, thereby leaving a lower portion of the first filler material layer in place as the first filler structure 704a. The etching process may be, for example, a wet etching process, a dry etching process, a RIE process, some other etching process, or a combination of the foregoing. In some embodiments, the etching process may be referred to as an etchback process. In some embodiments, a planarization process (e.g., chemical-mechanical polishing (CMP)) may be performed on the first filler structure 704a and the first dielectric layer 702a to planarize the upper surfaces of the first filler structure 704a and the first dielectric layer 702a.

Figure 12A:
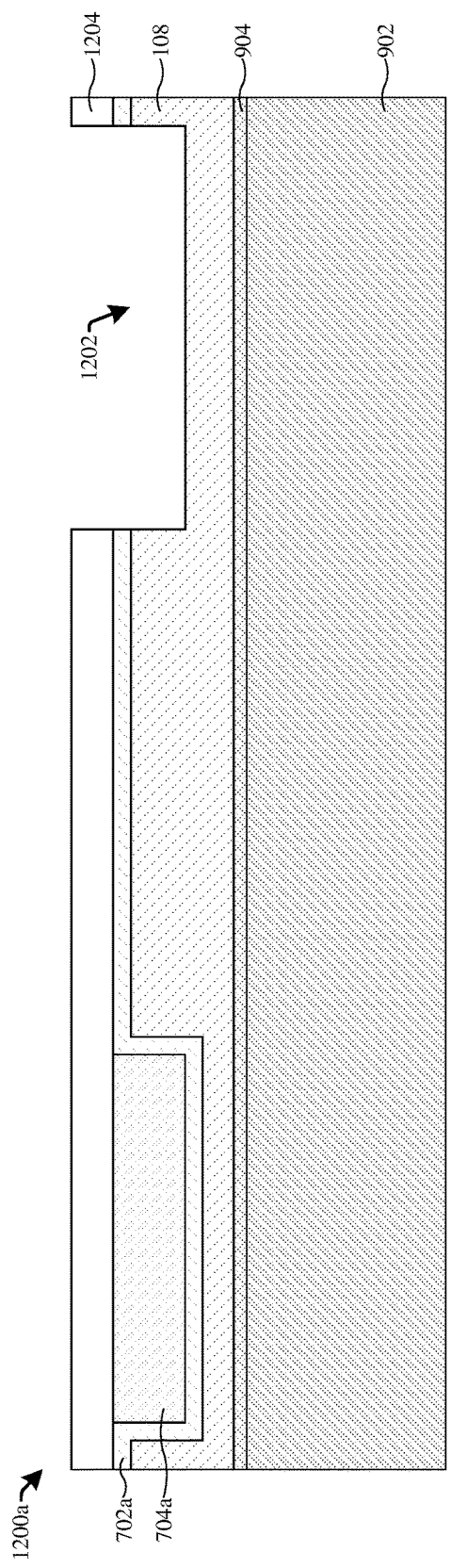

As shown in the cross-sectional view 1200a of FIG. 12A, a second recess 1202 is formed in the semiconductor layer 108. In some embodiments, the second recess 1202 is formed extending vertically into the semiconductor layer 108 a second depth that is different than (e.g., less than) the first depth. The second recess 1202 may be formed with substantially straight sidewalls, as shown in the cross-sectional view 1200a of FIG. 12A. In other embodiments, the second recess 1202 may be formed with angled and/or rounded sidewalls. In further embodiments, the second recess 1202 may be formed with a substantially planar bottom surface.

In some embodiments, a process for forming the second recess 1202 comprises forming a second patterned masking layer 1204 (e.g., positive/negative photoresist, a hardmask, etc.) over the semiconductor layer 108, the first dielectric layer 702a, and the first filler structure 704a. The second patterned masking layer 1204 may be formed in a substantially similar way as the first patterned masking layer 1004 (see, FIG. 10). Thereafter, with the second patterned masking layer 1204 in place, an etching process is performed on the first dielectric layer 702a and the semiconductor layer 108 to selectively etch the first dielectric layer 702a and the semiconductor layer 108 according to the second patterned masking layer 1204. The etching process removes unmasked portions of the first dielectric layer 702a and the semiconductor layer 108, thereby forming the second recess 1202. In some embodiments, the etching process may be, for example, a wet etching process, a dry etching process, a RIE process, some other etching process, or a combination of the foregoing. In further embodiments, the second patterned masking layer 1204 is subsequently stripped away.

Figure 13A:
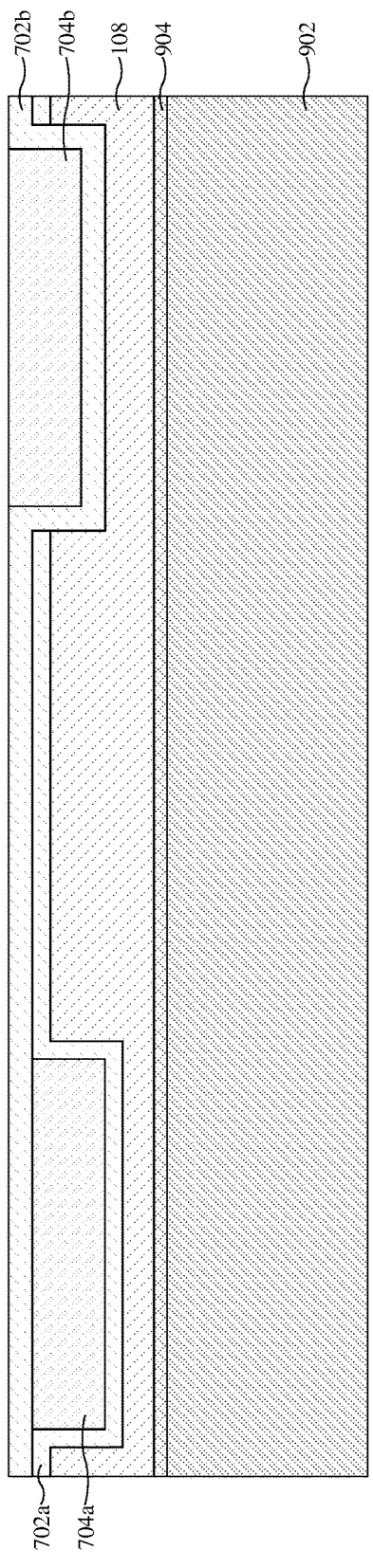

As shown in the cross-sectional view 1300a of FIG. 13A, a second dielectric layer 702b is formed over the semiconductor layer 108, the first dielectric layer 702a, the first filler structure 704a, and in the second recess 1202 (see, FIG. 12A). In some embodiments, the second dielectric layer 702b is formed lining the second recess 1202, the first dielectric layer 702a, and the first filler structure 704a. In further embodiments, the second dielectric layer 702b is formed as a conformal layer.

In some embodiments, a process for forming the second dielectric layer 702b comprises removing (e.g., stripping away) the second patterned masking layer 1204 (see, FIG. 12A). Thereafter, a second dielectric material is deposited on the semiconductor layer 108, the first dielectric layer 702a, and the first filler structure 704a, thereby forming the second dielectric layer 702b. The second dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. More specifically, in some embodiments, the second dielectric material is silicon dioxide ($SiO_2$). The second dielectric material may be deposited by, for example, CVD, PVD, ALD, some other deposition process, or a combination of the foregoing.

Also shown in the cross-sectional view 1300a of FIG. 13A, a second filler structure 704b is formed over the second dielectric layer 702b and in the second recess 1202. In some embodiments, the second filler structure 704b is formed extending vertically out of the second recess 1202 by a non-zero distance. In further embodiments, the second filler structure 704b is formed with an upper surface that is co-planar with an upper surface of the second dielectric layer 702b.

In some embodiments, a process for forming the second filler structure 704b comprises depositing a second filler material layer (not shown) over the second dielectric layer 702b and in the second recess 1202. The second filler material layer may be or comprise, for example, a semiconductor material (e.g., silicon (Si), germanium (Ge), etc.), a dielectric material different than the dielectric material of the second dielectric layer 702b, a ceramic, a high-k dielectric material, a low-k dielectric material, a polymer, some other filler material, or a combination of the foregoing. More specifically, in some embodiments, the second filler material layer is polysilicon. The second filler material layer may be deposited by, for example, CVD, PVD, ALD, sputtering, some other deposition process, or a combination of the foregoing.

Thereafter, an etching process is performed on the second filler material layer to remove an upper portion of the second filler material layer, thereby leaving a lower portion of the second filler material layer in place as the second filler structure 704b. The etching process may be, for example, a wet etching process, a dry etching process, a RIE process, some other etching process, or a combination of the foregoing. In some embodiments, the etching process may be referred to as an etchback process. In some embodiments, a planarization process (e.g., CMP) may be performed on the second filler structure 704b and the second dielectric layer 702b to planarize the upper surfaces of the second filler structure 704b and the second dielectric layer 702b.

As shown in the cross-sectional view 1400a of FIG. 14A, a third dielectric layer 702c is formed over the first dielectric layer 702a, the first filler structure 704a, the second dielectric layer 702b, and the second filler structure 704b. The third dielectric layer 702c may be formed with a substantially planar upper surface. In some embodiments, a process for forming the third dielectric layer 702c comprises depositing a third dielectric material on the second dielectric layer 702b and the second filler structure 704b, thereby forming the third dielectric layer 702c. The third dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. More specifically, in some embodiments, the third dielectric material is silicon dioxide ($SiO_2$). The third dielectric material may be deposited by, for example, CVD, PVD, ALD, some other deposition process, or a combination of the foregoing. Subsequently, a planarization process (e.g., CMP) may be performed on the third dielectric layer 702c to planarize the upper surface of the third dielectric layer 702c. In some embodiments, formation of the third dielectric layer 702c completes formation of an insulating structure 106. The insulating structure 106 comprises a first region 110, a second region 112, and a third region 202.

While FIGS. 11A-14A illustrate the insulating structure 106 being formed with the first dielectric layer 702a, the second dielectric layer 702b, the third dielectric layer 702c, the first filler structure 704a, and the second filler structure 704b, it will be appreciated that the insulating structure 106 may be formed with any number of filler structures 704 and/or any number of dielectric layers 702. It will also be appreciated that, in some embodiments (see, e.g., FIGS. 1-6), the insulating structure 106 may be formed without any filler structures (e.g., the insulating structure 106 may be a single dielectric structure). For example, cross-sectional views 1100b-1400b of FIGS. 11B-14B illustrate a series of cross-sectional views of some alternative embodiments for forming the insulating structure 106.

Figure 11B:
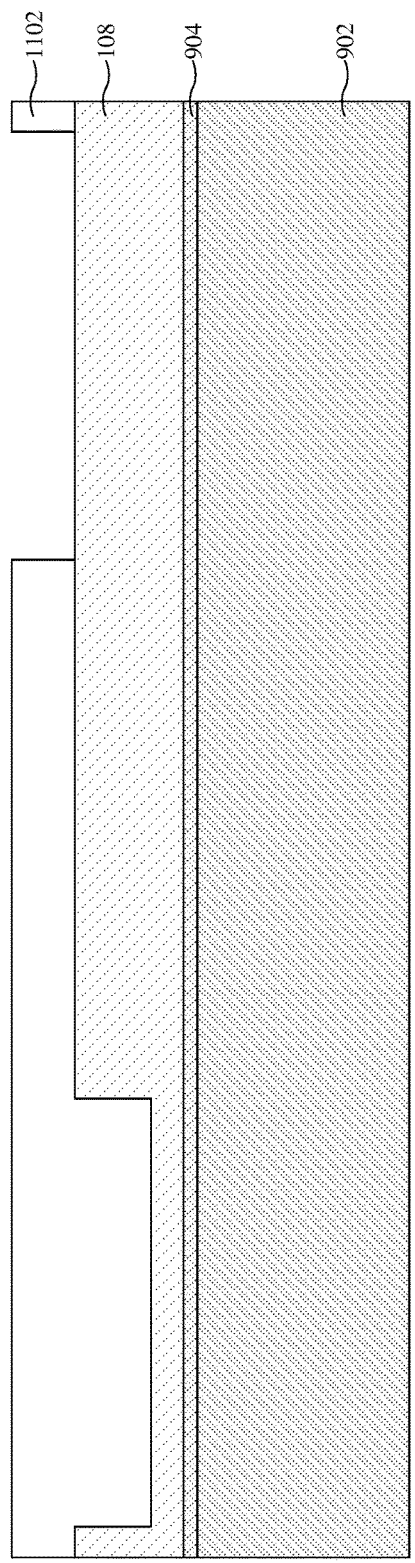

As shown in cross-sectional view 1100b of FIG. 11B, a third patterned masking layer 1102 (e.g., positive/negative photoresist, a hardmask, etc.) is formed over the semiconductor layer 108 and in the first recess 1002 (see, e.g., FIG. 10). The third patterned masking layer 1102 may be formed in a substantially similar manner as the second patterned masking layer 1204. As shown in cross-sectional view 1200b of FIG. 12B, an etching process is performed on the semiconductor layer 108 with the third patterned masking layer 1102 in place, thereby forming the second recess 1202 in the semiconductor layer 108. The etching process may be, for example, a wet etching process, a dry etching process, a RIE process, some other etching process, or a combination of the foregoing.

Figure 12B:
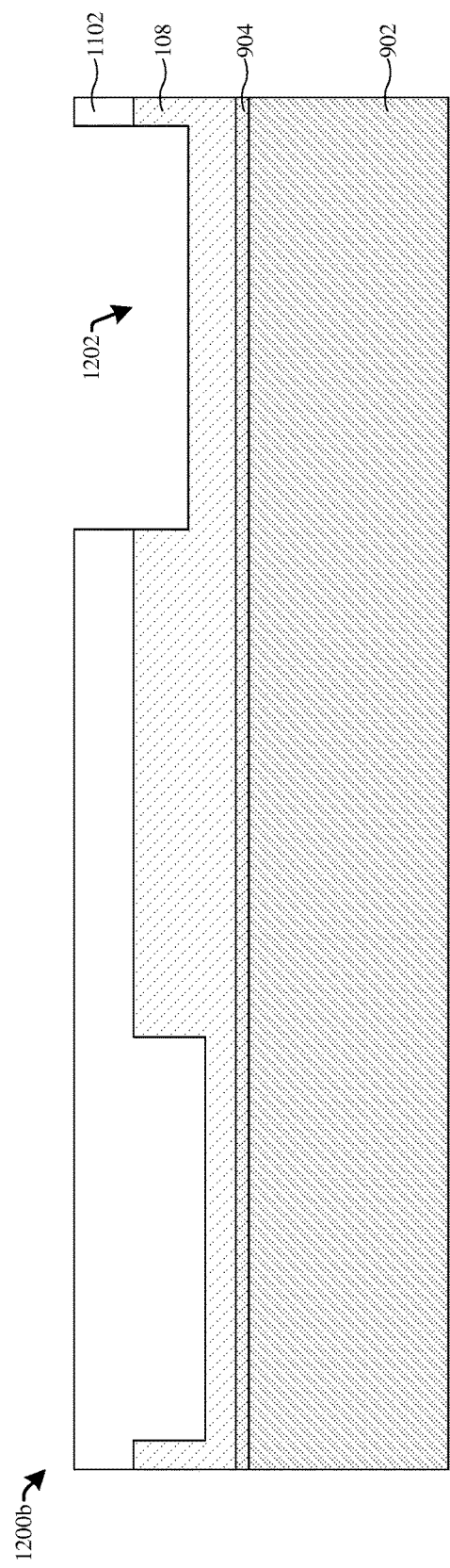
Figure 13B:
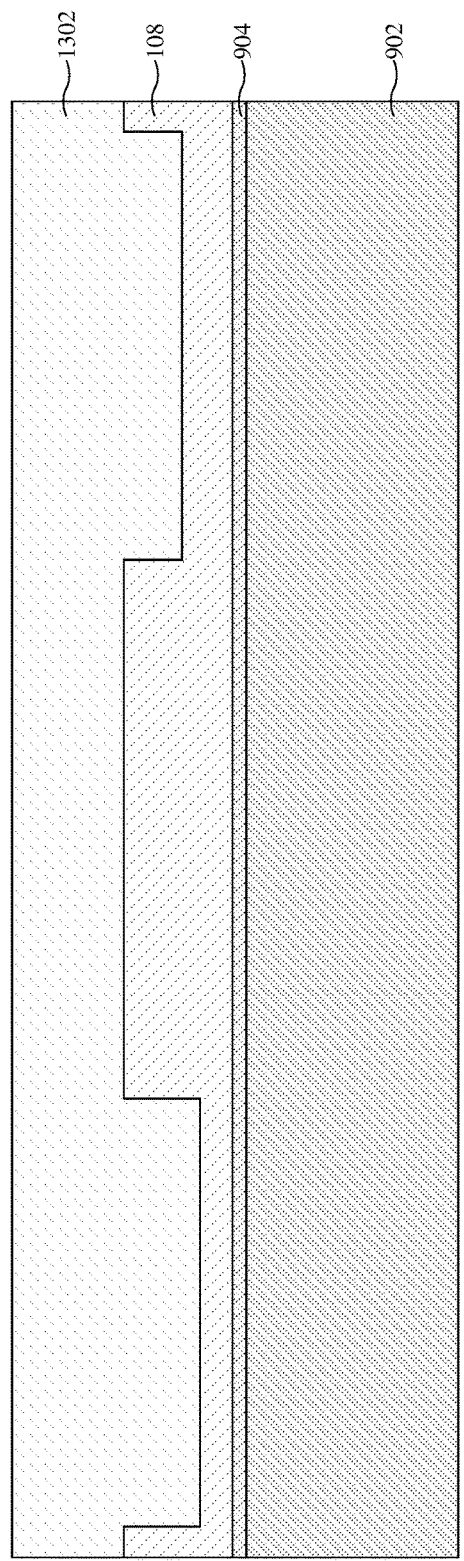

As shown in cross-sectional view 1300b of FIG. 13B, a fourth dielectric layer 1302 is formed over the semiconductor layer 108 and in both the first recess 1002 (see, FIG. 10) and the second recess 1202 (see, FIG. 12B). In some embodiments, a process for forming the fourth dielectric layer 1302 comprises removing (e.g., stripping away) the third patterned masking layer 1102 (see, FIG. 11B). Thereafter, a dielectric material is grown or deposited on the semiconductor layer 108 and in both the first recess 1002 and the second recess 1202, thereby forming the fourth dielectric layer 1302. The dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. More specifically, in some embodiments, the dielectric material is silicon dioxide ($SiO_2$). The dielectric material may be deposited or grown by, for example, CVD, PVD, ALD, thermal oxidation, some other deposition or growth process, or a combination of the foregoing.

As shown in cross-sectional view 1400b of FIG. 14b, in some embodiments, an upper portion of the fourth dielectric layer 1302 (illustrated by a dotted line in the cross-sectional view 1400b of FIG. 14B) is removed, thereby leaving a lower portion of the fourth dielectric layer 1302 in place as the insulating structure 106. In some embodiments, the upper portion of the fourth dielectric layer 1302 is removed by a planarization process (e.g., CMP) and/or an etchback process.

Figure 15:
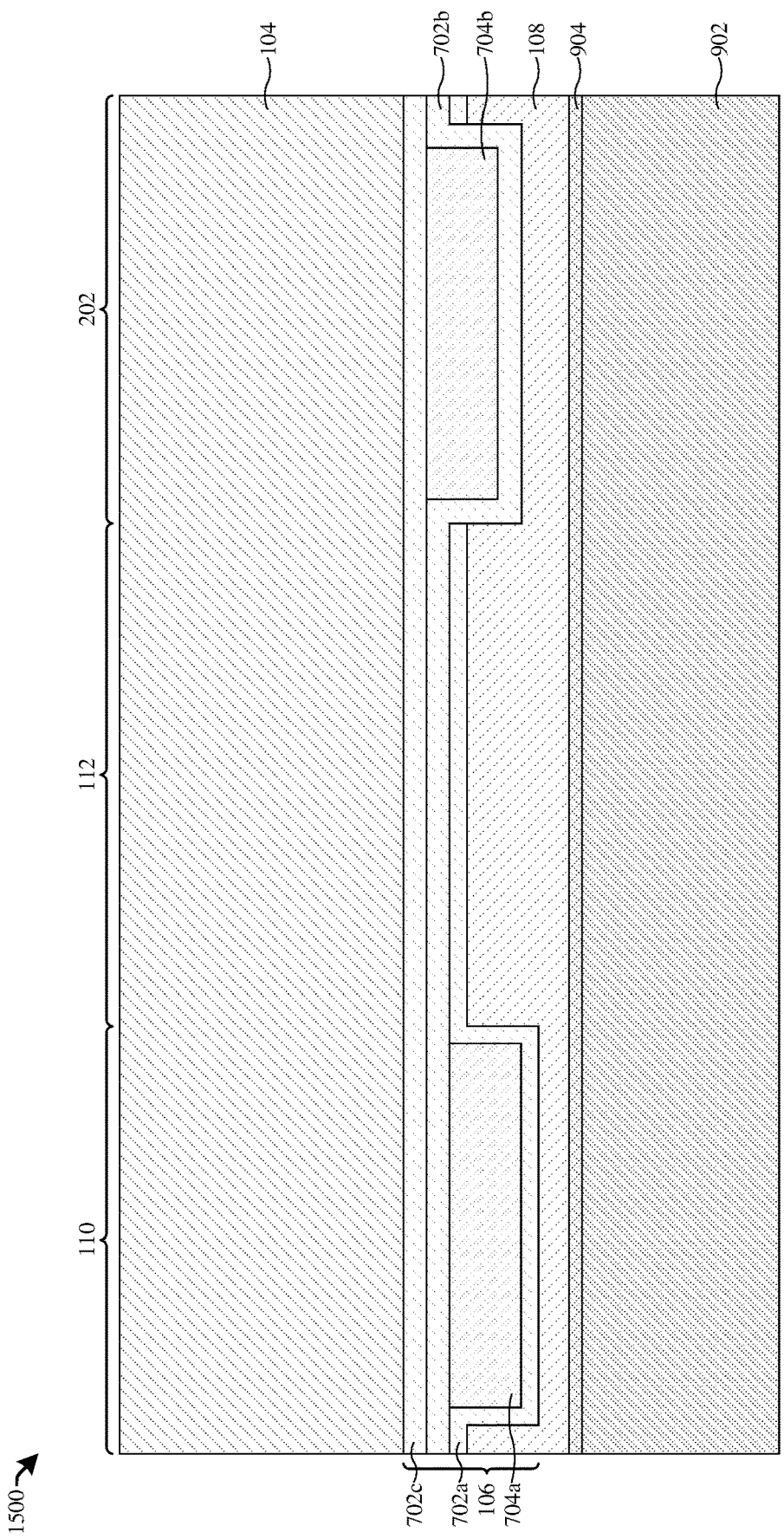

As shown in the cross-sectional view 1500 of FIG. 15, a semiconductor substrate 104 is bonded to the insulating structure 106 and the semiconductor layer 108. In some embodiments, the semiconductor substrate 902, the etch stop layer 904, the semiconductor layer 108, and the insulating structure 106 are collectively referred to as a workpiece. Thus, as shown in the cross-sectional view 1500 of FIG. 15, the semiconductor substrate 104 is bonded to the workpiece. In some embodiments, the semiconductor substrate 104 is bonded directly to the insulating structure 106. For example, the semiconductor substrate 104 may be bonded directly to the third dielectric layer 702c. The semiconductor substrate 104 is bonded to the workpiece via a bonding process, such as fusion bonding, eutectic bonding, or some other bonding process.

As shown in the cross-sectional view 1500 of FIG. 15, the cross-sectional view 1500 of FIG. 15 continues the method for forming the IC illustrated in FIGS. 9-14 from the cross-sectional view 1400a of FIG. 14A. Further, FIGS. 16-19 continue the method for forming the IC illustrated in FIGS. 9-15 from the cross-sectional view 1500 of FIG. 15. However, it will be appreciated that, in other embodiments, the method illustrated in FIGS. 15-19 could be continued from the cross-sectional view 1400b of FIG. 14B.

Figure 16:
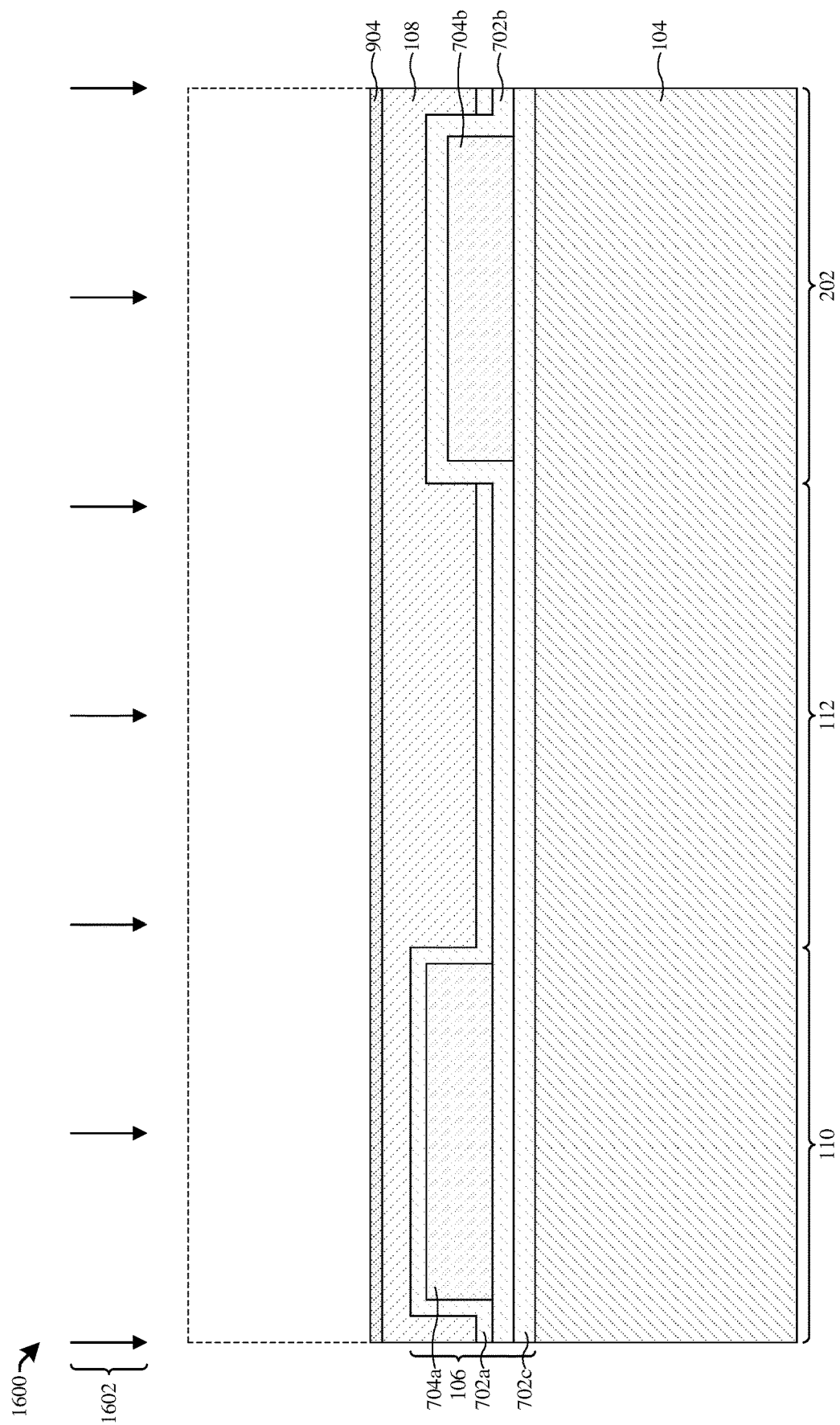

As shown in the cross-sectional view 1600 of FIG. 16, the semiconductor substrate 902 is removed (illustrated by a dotted line in the cross-sectional view 1600 of FIG. 16). In some embodiments, a process for removing the semiconductor substrate 902 comprises performing an etching process 1602 on the semiconductor substrate 902. In some embodiments, the etching process 1602 stops on the etch stop layer 904, as shown in the cross-sectional view 1600 of FIG. 16. In other embodiments, the etching process 1602 stops on the semiconductor layer 108.

The etching process 1602 may be, a wet etching process, a dry etching process, a RIE process, some other etching process, or a combination of the foregoing. In some embodiments, the etching process 1602 is an isotropic wet etching process. In further embodiments, the etching process 1602 is a hydrofluoric acid-nitric acid-acetic acid (HNA) etch (e.g., an etch that utilizes a HNA mixture as an etchant) or a tetramethylammonium hydroxide (TMAH) etch (e.g., an etch that utilizes a TMAH mixture as an etchant). It will be appreciated that at least some of the semiconductor substrate 902 may be removed by other suitable processes (e.g., CMP).

Figure 17:
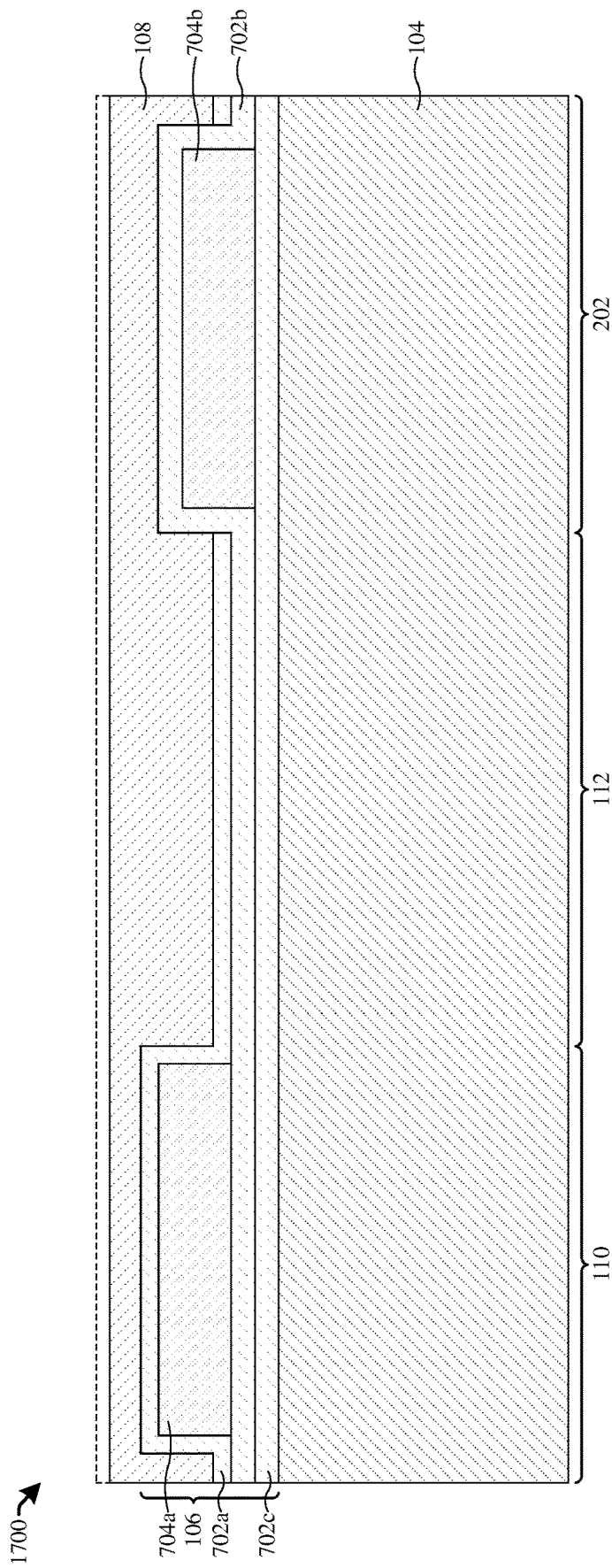

As shown in the cross-sectional view 1700 of FIG. 17, the etch stop layer 904 is removed (illustrated by a dotted line in the cross-sectional view 1700 of FIG. 17). In some embodiments, a process for removing the etch stop layer 904 comprises performing an etching process on the etch stop layer 904. The etching process may be, a wet etching process, a dry etching process, a RIE process, some other etching process, or a combination of the foregoing. In some embodiments, the etching process is a TMAH etch.

In some embodiments, the process for removing the etch stop layer 904 may also comprise performing a planarization process (e.g., CMP) on the etch stop layer 904. In further embodiments, the planarization process may also be performed on the semiconductor layer 108 to thin down the semiconductor layer 108 and planarize an upper surface of the semiconductor layer 108. In other embodiments, the planarization process may remove the etch stop layer 904 without performing the etching process on the etch stop layer 904 (e.g., only the CMP may be utilized to remove the etch stop layer 904).

Figure 18:
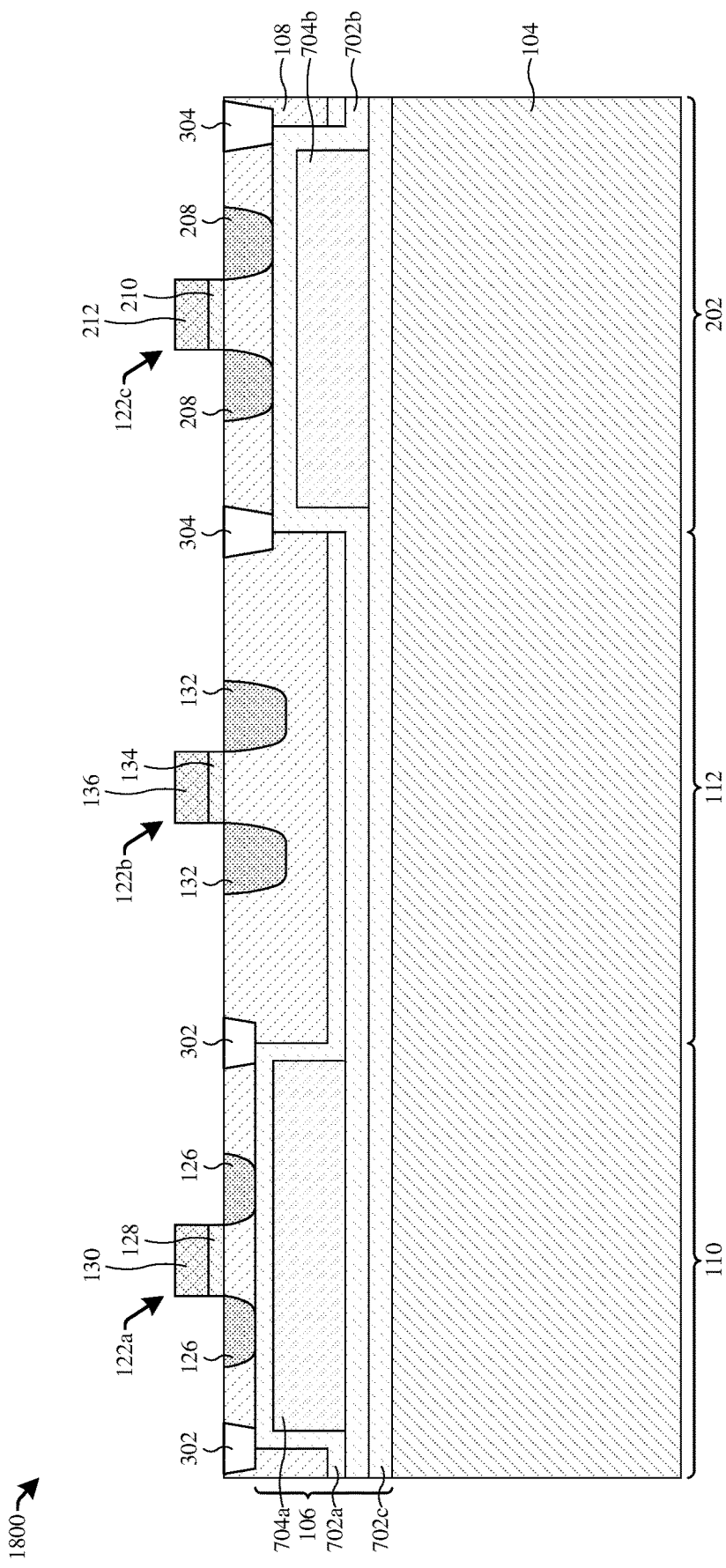

As shown in the cross-sectional view 1800 of FIG. 18, a first isolation structure 302 and a second isolation structure 304 are formed in the semiconductor layer 108. The first isolation structure 302 may be formed over (e.g., directly over) edges of the first region 110 of the insulating structure 106 (and over a first edge of the second region 112 of the insulating structure 106). The second isolation structure 304 may be formed over (e.g., directly over) edges of the third region 202 of the insulating structure 106 (and over a second edge of the second region 112 of the insulating structure 106). In some embodiments, a process for forming the first isolation structure 302 and the second isolation structure 304 comprises selectively etching the semiconductor layer 108 to form a first trench and a second trench in the semiconductor layer 108. Subsequently, the first trench and the second trench are filled with a dielectric material.

The semiconductor layer 108 is selectively etched by forming a first patterned masking layer (not shown) (e.g., positive/negative photoresist, a hardmask, etc.) over the semiconductor layer 108. Thereafter, with the first patterned masking layer in place, a first etching process is performed on the semiconductor layer 108 according to the first patterned masking layer. The first etching process removes unmasked portions of the semiconductor layer 108, thereby forming the first trench in the semiconductor layer 108. In some embodiments, the first etching process may be, for example, a wet etching process, a dry etching process, a RIE process, some other etching process, or a combination of the foregoing.

A second patterned masking layer (not shown) (e.g., positive/negative photoresist, a hardmask, etc.) is then formed over semiconductor layer 108 and covering the first trench. In some embodiments, the second patterned masking layer is formed over the semiconductor layer 108 and the first patterned masking layer. In other embodiments, the first patterned masking layer is stripped away before the second patterned masking layer is formed over the semiconductor layer 108. Thereafter, with the second patterned masking layer in place, a second etching process is performed on the semiconductor layer 108 according to the second patterned masking layer. The second etching process removes unmasked portions of the semiconductor layer 108, thereby forming the second trench in the semiconductor layer 108. In some embodiments, the second etching process may be, for example, a wet etching process, a dry etching process, a RIE process, some other etching process, or a combination of the foregoing. Subsequently, the second patterned masking layer (and the first patterned masking layer) are stripped away.

Thereafter, the first trench and the second trench are filled with the dielectric material. The dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foreign. In some embodiments, a process for filing the first and second trenches with the dielectric material comprises depositing or growing the dielectric material on the semiconductor layer 108 and in the first and second trenches. The dielectric material may be deposited or grown by, for example, CVD, PVD, ALD, thermal oxidation, some other deposition or growth process, or a combination of the foregoing. In some embodiments, a planarization process (e.g., a CMP) may be performed on the dielectric material to remove an upper portion of the dielectric material, thereby leaving a first lower portion of the dielectric material in the first trench as the first isolation structure 302 and a second lower portion of the dielectric material in the second trench as the second isolation structure 304. It will be appreciated that other isolation structures may also be formed in the semiconductor layer 108 by a substantially similar process (e.g., a third isolation structure 412, a fourth isolation structure 414, a fifth isolation structure 608, etc.).

Also shown in the cross-sectional view 1800 of FIG. 18, a plurality of semiconductor devices 122 are formed in the semiconductor layer 108 and over the insulating structure 106. For example, a first semiconductor device 122a, a second semiconductor device 122b, and a third semiconductor device 122c are formed in the semiconductor layer 108. The first semiconductor device 122a may be formed over (e.g., directly over) the first region 110 of the insulating structure 106, the second semiconductor device 122b may be formed over (e.g., directly over) the second region 112 of the insulating structure 106, and the third semiconductor device 122c may be formed over (e.g., directly over) the third region 202 of the insulating structure 106.

The first semiconductor device 122a comprises a pair of first source/drain regions 126, a gate dielectric 128, and a conductive gate electrode 130. The second semiconductor device 122b comprises a pair of second source/drain regions 132, a gate dielectric 134, and a conductive gate electrode 136. The third semiconductor device 122c comprises a pair of third source/drain regions 208, a gate dielectric 210, and a conductive gate electrode 212. The gate dielectric 128, the gate dielectric 134, and the gate dielectric 210 may be collectively referred to as the gate dielectrics 128/134/210. The conductive gate electrode 130, the conductive gate electrode 136, the conductive gate electrode 212 may be collectively referred to as the conductive gate electrodes 130/136/212.

In some embodiments, a process for forming the semiconductor devices 122 comprises depositing and/or growing (e.g., by CVD, PVD, ALD, thermal oxidation, etc.) a gate dielectric layer on the semiconductor layer 108. Next, a gate electrode layer is deposited (e.g., by CVD, PVD, ALD, sputtering, electrochemical plating, electroless plating, etc.) on the gate dielectric layer. Subsequently, the gate dielectric layer and the gate electrode layer are patterned and etched to form the gate dielectrics 128/134/210 and the 130/136/212. In further embodiments, the gate electrode layer may comprise, for example, polysilicon, a metal (e.g., Al, Cu, Ti, Ta, W, Mo, Co, etc.). In yet further embodiments, the gate dielectric layer may comprise, for example, an oxide (e.g., SiO₂), a nitride (e.g., SiN), a high-k dielectric (e.g., HfO. TaO, HfSiO, HfTaO, AlO, ZrO, etc.), or the like.

Thereafter, the first source/drain regions 126 are formed in the semiconductor layer 108 and on opposite sides of the gate dielectric 128. In some embodiments, the first source/drain regions 126 may be formed by a first selective implantation process (e.g., ion implantation, diffusion, etc.) that utilizes a first masking layer (not shown) disposed over the semiconductor layer 108 to selectively implant second doping type dopants (e.g., n-type dopants, such as phosphorus, arsenic, antimony, or the like) into the semiconductor layer 108. The first implantation process drives the second doping type dopants into the semiconductor layer 108 a first distance.

The second source/drain regions 132 are formed in the semiconductor layer 108 and on opposite sides of the gate dielectric 134. In some embodiments, the second source/drain regions 132 may be formed by a second selective implantation process (e.g., ion implantation, diffusion, etc.) that utilizes a second masking layer (not shown) disposed over the semiconductor layer 108 to selectively implant second doping type dopants into the semiconductor layer 108. The second implantation process drives the second doping type dopants into the semiconductor layer 108 a second distance different than the first distance.

The third source/drain regions 208 are formed in the semiconductor layer 108 and on opposite sides of the gate dielectric 210. In some embodiments, the third source/drain regions 208 may be formed by a third selective implantation process (e.g., ion implantation, diffusion, etc.) that utilizes a third masking layer (not shown) disposed over the semiconductor layer 108 to selectively implant second doping type dopants into the semiconductor layer 108. The third implantation process drives the second doping type dopants into the semiconductor layer 108 a third distance different than the first distance and/or the second distance. It will be appreciated that, in other embodiments, the first source/drain regions 126, the second source/drain regions 132, and the third source/drain regions 208 may be formed by less than (or greater than) three implantation processes (e.g., the first source/drain regions 126, the second source/drain regions 132, and the third source/drain regions 208 may be formed by a single selective implantation process).

Figure 19:
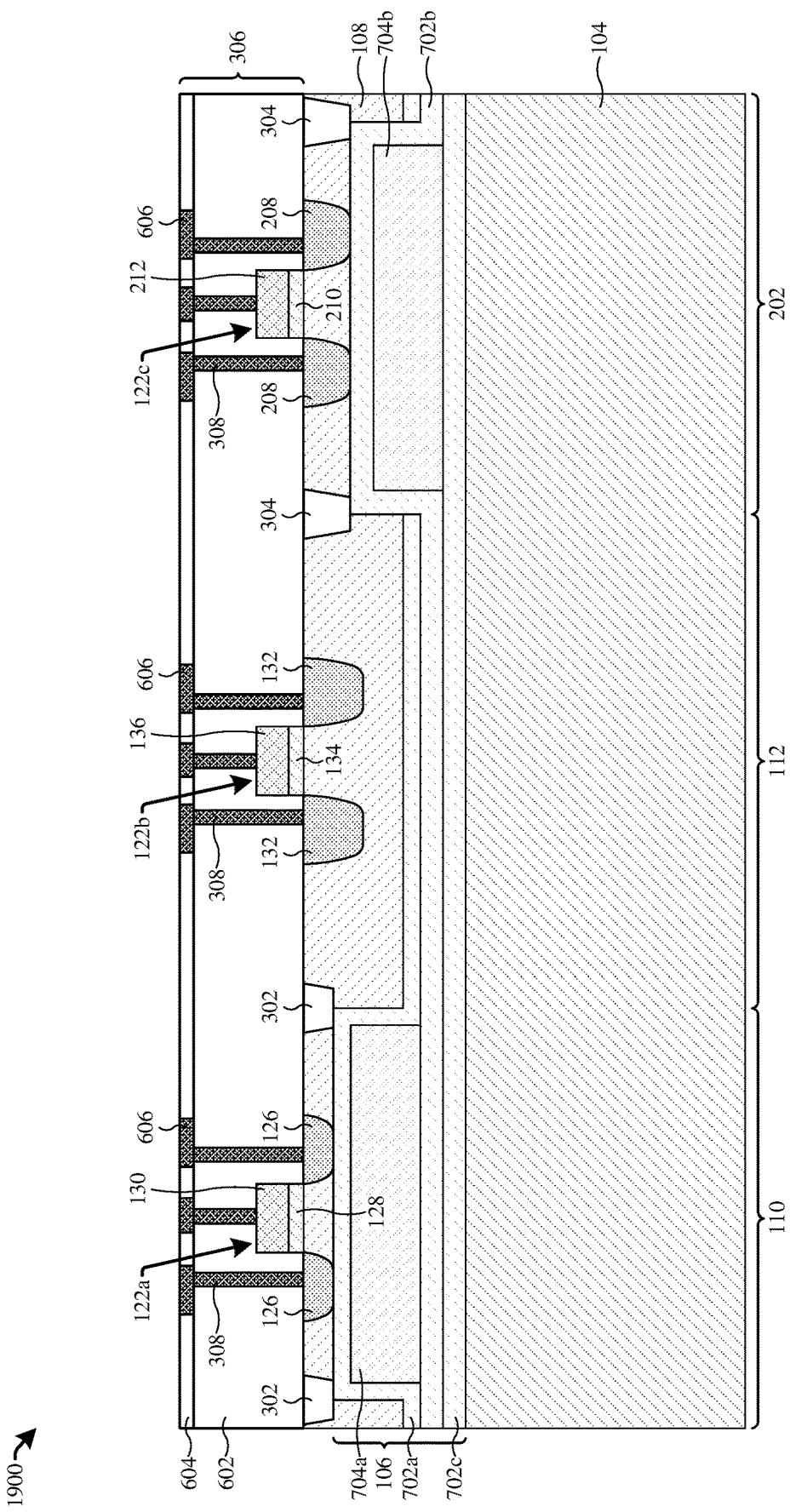

As shown in the cross-sectional view 1900 of FIG. 19, an ILD structure 306 is formed over the semiconductor layer 108 and the semiconductor devices 122. In some embodiments, the ILD structure 306 comprises a first ILD layer 602 and a second ILD layer 604. Also shown in the cross-sectional view 1900 of FIG. 19, a plurality of conductive contacts 308 and a plurality of conductive lines 606 are formed over the semiconductor layer 108 and embedded in the ILD structure 306. The conductive contacts 308 and the conductive lines 606 are part of an interconnect structure this is embedded in the ILD structure 306 and configured to electrically couple the semiconductor devices 122 together in a predefined manner.

In some embodiments, a process for forming the ILD structure 306, the conductive contacts 308, and the conductive lines 606 comprises depositing the first ILD layer 602 over the semiconductor layer 108 and the semiconductor devices 122. The first ILD layer 602 may be formed by, for example, CVD, PVD, ALD, some other deposition process, or a combination of the foregoing. Thereafter, contact openings are formed in the first ILD layer 602. A conductive material (e.g., tungsten (W)) is then formed on the first ILD layer 602 and in the contact openings. The conductive material may be formed using a deposition process (e.g., CVD, PVD, sputtering, etc.) and/or a plating process (e.g., electrochemical plating, electroless plating, etc.). Thereafter, a planarization process (e.g., CMP) is performed into the conductive material to form the conductive contacts 308 in the first ILD layer 602.

The second ILD layer 604 is then formed over the first ILD layer 602 and the conductive contacts 308. The second ILD layer 604 may be formed by, for example, CVD, PVD, ALD, some other deposition process, or a combination of the foregoing. A plurality of trenches are then formed in the second ILD layer 604. A conductive material (e.g., copper (Cu)) is formed on the second ILD layer 604 and in the trenches. The conductive material may be formed using a deposition process (e.g., CVD, PVD, sputtering, etc.) and/or a plating process (e.g., electrochemical plating, electroless plating, etc.). Thereafter, a planarization process (e.g., CMP) is performed into the conductive material to form the conductive lines 606 in the second ILD layer 604. Although not shown, it will be appreciated that any number of other conductive features (e.g., conductive lines and conductive vias) and ILD layers may be formed over the semiconductor layer 108 and the semiconductor devices 122, thereby forming the ILD structure 306 with the interconnect structure embedded therein.

Figure 20:
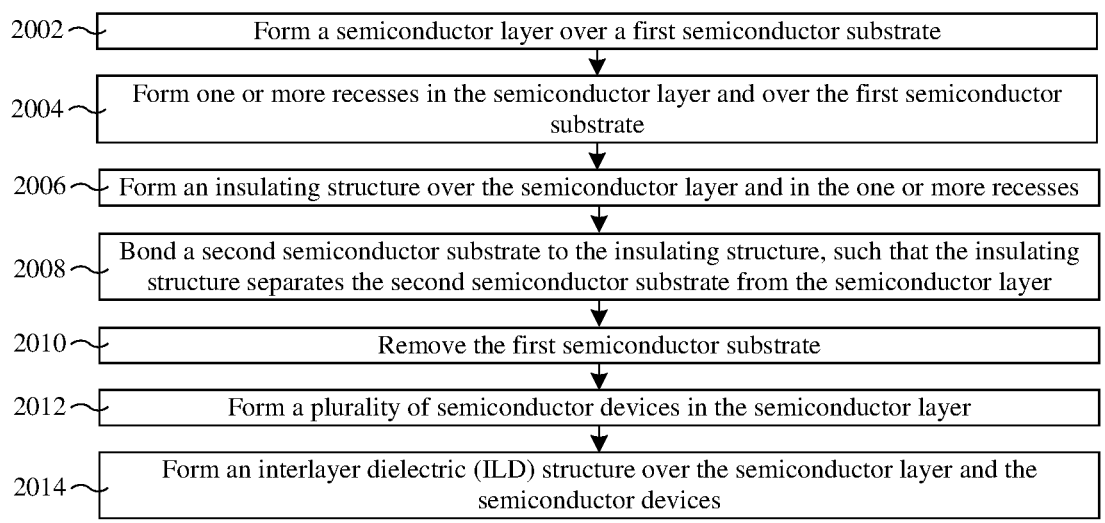
FIG. 20 illustrates a flowchart of some embodiments of a method for forming an IC comprising a SOI substrate having a semiconductor layer with different thicknesses.

FIG. 20 illustrates a flowchart 2000 of some embodiments of a method for forming an IC comprising a SOI substrate having a semiconductor layer with different thicknesses. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2002, a semiconductor layer is formed over a first semiconductor substrate. FIG. 9 illustrates a cross-sectional view 900 of some embodiments corresponding to act 2002.

At act 2004, one or more recesses are formed in the semiconductor layer and over the first semiconductor substrate. FIGS. 10-12 illustrate a series of cross-sectional views 1000-1200 of some embodiments corresponding to act 2004.

At act 2006, an insulating structure is formed over the semiconductor layer and in the one or more recesses. FIGS. 11-14 illustrate a series of cross-sectional views 1100-1400 of some embodiments corresponding to act 2006.

At act 2008, a second semiconductor substrate is bonded to the insulating structure, such that the insulating structure separates the second semiconductor substrate from the semiconductor layer. FIG. 15 illustrates a cross-sectional view 1500 of some embodiments corresponding to act 2008.

At act 2010, the first semiconductor substrate is removed. FIGS. 16-17 illustrate a series of cross-sectional views 1600-1700 of some embodiments corresponding to act 2010.

At act 2012, a plurality of semiconductor devices are formed in the semiconductor layer. FIG. 18 illustrates a cross-sectional view 1800 of some embodiments corresponding to act 2012.

At act 2014, an interlayer dielectric (ILD) structure is formed over the semiconductor layer and the semiconductor devices. FIG. 19 illustrates a cross-sectional view 1900 of some embodiments corresponding to act 2014.

In some embodiments, the present application provides an integrated chip. The integrated chip comprises a semiconductor substrate. A semiconductor layer is disposed over the semiconductor substrate. An insulating structure is buried between the semiconductor substrate and the semiconductor layer. The insulating structure has a first region and a second region. The insulating structure has a first thickness in the first region of the insulating structure, and the insulating structure has a second thickness different than the first thickness in the second region of the insulating structure.

In some embodiments, the present application provides an integrated chip. The integrated chip comprises a semiconductor substrate. An insulating structure is disposed over the semiconductor substrate. A semiconductor layer is disposed over the insulating structure. An upper surface of the semiconductor layer is substantially planar. The upper surface of the semiconductor layer overlies both a first lower surface of the semiconductor layer and a second lower surface of the semiconductor layer. The first lower surface of the semiconductor layer is vertically spaced from the upper surface of the semiconductor layer by a first distance, and the second lower surface of the semiconductor layer is vertically spaced from the upper surface of the semiconductor layer by a second distance different than the first distance.

In some embodiments, the present application provides a method for forming an integrated chip. The method comprises receiving a workpiece comprising a semiconductor layer disposed over a first semiconductor substrate. A recess is formed in the semiconductor layer. A first insulating layer is formed over the semiconductor layer and in the recess. A second semiconductor substrate is bonded to the workpiece, such that the first insulating layer separates the second semiconductor substrate from the semiconductor layer. After the second semiconductor substrate is bonded to the workpiece, the first semiconductor substrate is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), comprising:
   receiving a workpiece comprising a semiconductor layer disposed over a first semiconductor substrate;
   forming a first recess in the semiconductor layer;
   forming a first insulating layer over the semiconductor layer and in the first recess;
   after forming the first insulating layer, etching completely through the first insulating layer and into the semiconductor layer to form a second recess that is laterally separated from the first recess by a part of the semiconductor layer;
   forming a second insulating layer over the semiconductor layer and in the second recess;
   bonding a second semiconductor substrate to the workpiece, such that the second insulating layer separates the second semiconductor substrate from the semiconductor layer; and
   after the second semiconductor substrate is bonded to the workpiece, removing the first semiconductor substrate.

2. The method of claim 1, wherein after etching the semiconductor layer to form the first recess,
   forming a masking layer over the semiconductor layer; and
   with the masking layer in place over the semiconductor layer, etching the semiconductor layer.

3. The method of claim 1, wherein sidewalls of the first insulating layer are on opposing sides of the second recess.

4. The method of claim 1, further comprising:
   before the second semiconductor substrate is bonded to the first insulating layer, depositing a filler structure over the first insulating layer and in the first recess; and
   before the second semiconductor substrate is bonded to the first insulating layer, forming a third insulating layer over the first insulating layer and the filler structure.

5. The method of claim 1, wherein bonding the second semiconductor substrate to the workpiece comprises bonding the first insulating layer to the second semiconductor substrate.

6. A method of forming an integrated chip (IC), comprising:
   etching a first surface of a semiconductor material to form a first recess and a second recess at different depths within the semiconductor material, wherein the semiconductor material is over a first substrate, wherein a topmost surface of the semiconductor material extends between an inner sidewall of the semiconductor material that forms the first recess and an inner sidewall of the semiconductor material that forms the second recess when viewed from a cross-section;
forming a first insulating material within the first recess and over the semiconductor material;
bonding the first substrate to a second substrate so that the semiconductor material and the first insulating material are between the first substrate and the second substrate;
removing the first substrate to expose a second surface of the semiconductor material;
forming a first semiconductor device over the first recess; and
forming a second semiconductor device outside of the first recess.

7. The method of claim 6, further comprising:
performing a planarization process along the second surface of the semiconductor material.

8. The method of claim 6, further comprising:
forming a filler material over the first insulating material and within the first recess;
forming a second insulating material over the first insulating material and the filler material and within the second recess; and
forming a second filler material over the second insulating material and within the second recess.

9. The method of claim 6, further comprising:
forming a third insulating material within the second recess and over the semiconductor material.

10. The method of claim 6, wherein the second recess is formed prior to forming the first recess within the semiconductor material.

11. The method of claim 9, further comprising:
etching the third insulating material and the semiconductor material to form the first recess within the semiconductor material.

12. The method of claim 6, wherein the inner sidewall of the first recess is substantially straight.

13. The method of claim 12, wherein the first insulating material completely fills the first recess and the second recess.

14. The method of claim 6,
wherein the first semiconductor device comprises a pair of first source/drain regions that extend into the semiconductor material to a first depth; and
wherein the second semiconductor device comprises a pair of second source/drain regions that extend into the semiconductor material to a second depth.

15. A method of forming an integrated chip (IC), comprising:
forming an insulating material onto a semiconductor material disposed over a first substrate, wherein the semiconductor material has different thicknesses within a plurality of different regions of the semiconductor material;
forming an additional semiconductor material onto the insulating material and directly between sidewalls of the semiconductor material;
bonding a second substrate to the first substrate so that the insulating material, the additional semiconductor material, and the semiconductor material are between the first substrate and the second substrate; and
removing the first substrate to expose a substantially flat surface of the semiconductor material, the substantially flat surface extending over the plurality of different regions of the semiconductor material.

16. The method of claim 15, further comprising:
etching the semiconductor material prior to bonding the second substrate to the first substrate.

17. The method of claim 15, wherein the additional semiconductor material is completely confined between interior sidewalls of the insulating material facing one another.

18. The method of claim 15, further comprising:
forming a first pair of source/drain regions within the semiconductor material and within a first region of the plurality of different regions of the semiconductor material; and
forming a second pair of source/drain regions within the semiconductor material and within a second region of the plurality of different regions of the semiconductor material, the second pair of source/drain regions having a different height than the first pair of source/drain regions.

19. The method of claim 18, wherein the first pair of source/drain regions and the second pair of source/drain regions extend through the semiconductor material to the insulating material.

20. The method of claim 15, wherein the first substrate is removed by an etching process that stops on an etch stop layer arranged on the semiconductor material.

* * * * *